(12) United States Patent
Schaeffer et al.

(10) Patent No.: US 11,139,375 B2
(45) Date of Patent: Oct. 5, 2021

(54) SEMICONDUCTOR DEVICE AND METHOD OF MANUFACTURING A SEMICONDUCTOR DEVICE

(71) Applicant: Infineon Technologies AG, Neubiberg (DE)

(72) Inventors: Carsten Schaeffer, Annenheim (AT); Alexander Breymesser, Villach (AT); Bernhard Goller, Villach (AT); Ronny Kern, Finkenstein (DE); Matteo Piccin, Villach (AT); Roland Rupp, Lauf (DE); Francisco Javier Santos Rodriguez, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 21 days.

(21) Appl. No.: 16/502,451

(22) Filed: Jul. 3, 2019

(65) Prior Publication Data
US 2020/0013859 A1   Jan. 9, 2020

(30) Foreign Application Priority Data

Jul. 3, 2018 (DE) .......................... 102018116051.8

(51) Int. Cl.
*H01L 29/16* (2006.01)
*H01L 21/784* (2006.01)
(Continued)

(52) U.S. Cl.
CPC ........ *H01L 29/1608* (2013.01); *H01L 21/046* (2013.01); *H01L 21/0485* (2013.01);
(Continued)

(58) Field of Classification Search
CPC . H01L 21/046; H01L 21/0485; H01L 21/784; H01L 2221/68327; H01L 2221/68381; H01L 24/48; H01L 29/1608; H01L 29/6606; H01L 29/66068; H01L 21/78; H01L 2221/68309; H01L 2221/6834; H01L 2221/68372; H01L 2221/68377; H01L 2223/54426; H01L 2224/02166; H01L 2224/03; H01L 2224/04034; H01L 2224/04042; H01L 2224/05567; H01L 2224/0603;
(Continued)

(56) References Cited

U.S. PATENT DOCUMENTS 9,165,871 B2 * 10/2015 Miyanagi ................ H01L 24/73
2009/0233419 A1   9/2009 Arai
(Continued)

FOREIGN PATENT DOCUMENTS

DE   102011051822 A1   1/2012
DE   102015112649 A1   2/2017

*Primary Examiner* — Jonathan Han
(74) *Attorney, Agent, or Firm* — Cooper Legal Group LLC

(57) ABSTRACT

According to an embodiment of a method described herein, a silicon carbide substrate is provided that includes a plurality of device regions. A front side metallization may be provided at a front side of the silicon carbide substrate. The method may further comprise providing an auxiliary structure at a backside of the silicon carbide substrate. The auxiliary structure includes a plurality of laterally separated metal portions. Each metal portion is in contact with one device region of the plurality of device regions.

20 Claims, 16 Drawing Sheets

(51) Int. Cl.
*H01L 21/683* (2006.01)
*H01L 21/04* (2006.01)
*H01L 29/66* (2006.01)
*H01L 23/31* (2006.01)
*H01L 23/00* (2006.01)
*H01L 29/45* (2006.01)

(52) U.S. Cl.
CPC ........ *H01L 21/6835* (2013.01); *H01L 21/784* (2013.01); *H01L 29/6606* (2013.01); *H01L 29/66068* (2013.01); *H01L 23/3121* (2013.01); *H01L 24/48* (2013.01); *H01L 24/83* (2013.01); *H01L 29/45* (2013.01); *H01L 2221/68327* (2013.01); *H01L 2221/68372* (2013.01); *H01L 2221/68377* (2013.01); *H01L 2221/68381* (2013.01); *H01L 2224/48091* (2013.01); *H01L 2224/48106* (2013.01); *H01L 2224/48245* (2013.01); *H01L 2224/8382* (2013.01); *H01L 2224/8384* (2013.01); *H01L 2224/83894* (2013.01)

(58) Field of Classification Search
CPC . H01L 2224/06181; H01L 2224/27002; H01L 2224/2908; H01L 2224/29124; H01L 2224/29139; H01L 2224/29155; H01L 2224/29164; H01L 2224/32245; H01L 2224/40247; H01L 2224/48091; H01L 2224/48106; H01L 2224/48245; H01L 2224/48247; H01L 2224/48464; H01L 2224/73263; H01L 2224/73265; H01L 2224/83; H01L 2224/83005; H01L 2224/83193; H01L 2224/8382; H01L 2224/8384; H01L 2224/83894; H01L 2224/94; H01L 2224/97; H01L 23/3107; H01L 23/3121; H01L 23/482; H01L 23/49517; H01L 23/49562; H01L 23/544; H01L 24/05; H01L 24/27; H01L 24/29; H01L 24/32; H01L 24/40; H01L 24/73; H01L 24/83; H01L 24/94; H01L 29/45; H01L 29/7395; H01L 29/7802; H01L 29/8611; H01L 2924/00012; H01L 2924/00014; H01L 21/6835
USPC .......................................................... 257/77
See application file for complete search history.

(56) References Cited

U.S. PATENT DOCUMENTS

2013/0285086 A1* 10/2013 Hu ........................... H01L 24/95
 257/98
2014/0252373 A1 9/2014 Mauder et al.
2015/0069591 A1* 3/2015 Fischer .................. H01L 24/94
 257/676
2017/0033011 A1* 2/2017 Rupp ...................... H01L 21/78

* cited by examiner

SEMICONDUCTOR DEVICE AND METHOD OF MANUFACTURING A SEMICONDUCTOR DEVICE

RELATED APPLICATION

This application claims priority to German Patent Application No. 102018116051.8, filed on Jul. 3, 2018, entitled "SEMICONDUCTOR DEVICE AND METHOD OF MANUFACTURING A SEMICONDUCTOR DEVICE", which is incorporated herein.

TECHNICAL FIELD

The present disclosure relates to a method of manufacturing semiconductor devices and to a semiconductor device.

BACKGROUND

Semiconductor wafers are typically available in standard wafer sizes and/or thicknesses. For example, standard wafer diameters may be 2 inch (50 mm), 4 inch (100 mm) or 6 inch (150 mm). For silicon carbide wafers, a standard wafer thickness may be, for example, 350 µm. Attempts have been made to reduce the final thickness of semiconductor material to improve device characteristics. For example, in power semiconductor devices with a vertical load current flow between a front side and a backside, a thinner semiconductor die may result in lower on-state resistance. Wafer split methods aim at horizontally splitting wafers in a plurality of thin wafers to save costs, but brittle semiconductor material may complicate the handling of semiconductor wafers that are thinner than standard wafers. An auxiliary carrier can be reversibly bonded to a front side of a semiconductor wafer to increase mechanical stability. The auxiliary carrier is typically removed before wafer dicing.

SUMMARY

An embodiment of the present disclosure relates to a method of manufacturing a semiconductor device. A silicon carbide substrate is provided that includes a plurality of device regions. Further, a front side metallization is provided at a front side of the silicon carbide substrate. An auxiliary structure is provided at a backside of the silicon carbide substrate. The auxiliary structure includes a plurality of laterally separated metal portions. Each metal portion is in contact with one device region of the plurality of device regions.

Another embodiment of the present disclosure relates to another method of manufacturing a semiconductor device. A silicon carbide substrate is provided. Further, a front side metallization is provided at a front side of the silicon carbide substrate and a backside metallization is provided at a backside of the silicon carbide substrate. A metal disc is provided such that the metal disc and the backside metallization are structurally connected.

A further embodiment of the present disclosure relates to a semiconductor device. The semiconductor device includes a silicon carbide body, a first load electrode at a front side of the silicon carbide body, a second load electrode at a backside of the silicon carbide body and a metal plate in contact with the second load electrode. A thickness of the metal plate is at least 30 µm and at most 300 µm. A load terminal is in contact with the metal plate.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of the semiconductor device and the method of manufacturing a semiconductor device and together with the description serve to explain principles of the embodiments. Further embodiments are described in the following detailed description and the claims.

DETAILED DESCRIPTION

Figure 1:
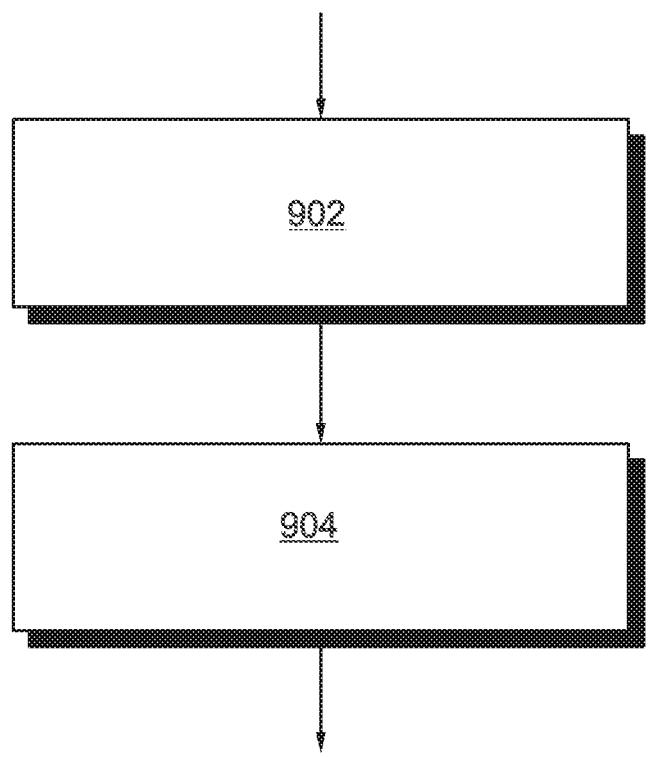
FIG. 1 is a simplified schematic flowchart illustrating a method of manufacturing semiconductor devices according to an embodiment.

In the following detailed description, reference is made to the accompanying drawings, which form a part hereof and in which are shown by way of illustrations specific embodiments in which a silicon carbide device and a method of manufacturing a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. In particular, features described in connection with an embodiment of the method are also disclosed for embodiments of the semiconductor device and vice versa.

The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising", "with" and the like are open, and the terms indicate the presence of stated structures, elements or features but do not preclude additional elements or features. The articles "a", "an" and "the" are intended to include the plural as well as the singular, unless the context clearly indicates otherwise.

Furthermore, the term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for a parameter include the boundary values. For example, a range for a parameter y from a to b reads as a≤y≤b. A parameter y with a value of at least c reads as c≤y and a parameter y with a value of at most d reads as y≤d.

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

IGFETs (insulated gate field effect transistor) are voltage controlled devices including MOSFETs (metal oxide semiconductor FETs) and other FETs with gate electrodes based on doped semiconductor material and/or with gate dielectrics that are not or not exclusively based on an oxide.

According to an embodiment a method of manufacturing a semiconductor device, e.g., a silicon carbide device, may include providing a semiconductor substrate, e.g., a silicon carbide substrate.

In the following, embodiments of the methods and embodiments of the semiconductor devices are explained in connection with silicon carbide as a semiconductor material of the semiconductor substrate. However, the methods described herein may be suitable for providing a semiconductor device with any other semiconductor material by replacing the silicon carbide substrate with a different semiconductor substrate. For example, a wide-bandgap semiconductor material (e.g., with GaN, AlN or $Ga_2O_3$ as main constituents) may be used as a semiconductor material.

Furthermore, even though the method is described in connection with a semiconductor substrate comprising only one type of semiconductor material (namely: silicon carbide), the semiconductor substrate may also include different types of semiconductor material. For example, the semiconductor substrate may comprise an epitaxial layer of a first semiconductor material (e.g., GaN) and a semiconductor wafer of a second, different semiconductor material (e.g., Si), onto which the first semiconductor material has been epitaxially grown. In addition or as an alternative, the semiconductor substrate may comprise a layer stack of different semiconductor materials and/or different compositions of semiconductor materials. For example, in the case of an epitaxial layer of a first semiconductor material on a semiconductor wafer of a second semiconductor material, an intermediary layer stack (e.g., for matching the lattice constants and/or the thermal expansion coefficients of the first and the second semiconductor material) may be positioned between epitaxial layer and the wafer.

The method may be suitable for providing a semiconductor device with a semiconductor substrate of a high-priced semiconductor material. Throughout this application, a high-priced semiconductor material is a semiconductor material that requires a high-priced semiconductor wafer and/or a high-priced growth substrate for providing the semiconductor device. "High-priced" in this context may mean that the semiconductor wafer and/or the growth substrate is more expensive than a silicon carbide wafer of the same size, e.g. with a comparable crystal quality. In addition or as an alternative, "high-priced" may mean that at least 30%, or at least 40%, of the final costs for the bare-die part of the semiconductor device (i.e., without packaging or circuitry) may be determined by the price of the semiconductor wafer and/or the growth substrate.

The silicon carbide substrate may be a silicon carbide wafer as a growth substrate onto which an epitaxial material may be grown. In addition or as an alternative, the silicon carbide substrate may be an epitaxial layer. For example, the silicon carbide substrate may have been epitaxially grown on a silicon carbide wafer as a growth substrate, after which epitaxial growth at least part of the silicon carbide wafer is removed. It may also be possible that the silicon carbide substrate corresponds to the silicon carbide wafer, wherein doping regions may have been introduced into the silicon carbide wafer.

The semiconductor device manufactured with embodiments of methods described herein may be a power semiconductor device. For example, the semiconductor device may be a field-effect transistor (FET; e.g. a MOSFET or a JFET), an IGBT, or a diode (e.g., a merged-pin Schottky diode or a merged-pin heterojunction diode) or a combination of them.

The silicon carbide substrate may include a plurality of device regions. The plurality of device regions may, for instance, be laterally separated by an idle region. In other words, an idle region may be arranged between two neighboring device regions. The idle region may be formed in the silicon carbide substrate, that is to say, may be part of the silicon carbide substrate. The idle region may be grid-shaped, i.e., may have the shape of a grid in a top view onto the silicon carbide substrate. The idle region may frame the respective device regions.

A front side metallization may be provided at a front side of the silicon carbide substrate. The front side metallization may be formed in a single piece or may comprise a plurality of separated portions. The separated portions may be formed in a multi-sectional and/or in a multi-piece manner. Here and in the following, an element or portions of said element being formed in a "multi-sectional manner" may mean that the portions of the element are connected via smaller bridges. A top face of a "multi-sectional" element may be coherent, but not simply coherent. For example, a "multi-sectional" element may comprise holes and/or gaps between the portions of said element. Further, here and in the following, an element or portions of said element being formed in a "multi-piece manner" may mean that the portions are free of an interconnection, i.e., the portions are separated from one another. A top face of a "multi-sectional" element may not be coherent. If portions of an element are formed "multi-sectional" and "multi-piece" at the same time, said element may comprise a first part with first portions being formed in a multi-sectional manner and a second part with second portions being formed in a multi-piece manner, wherein the first part and the second part may be formed in a multi-piece manner with one another.

Each part of the front side metallization may be assigned to a device region in a one-to-one manner. In one embodiment, the front side metallization may be provided at the front side before an auxiliary structure is provided at the backside.

The silicon carbide substrate and the front side metallization collectively may form a workpiece, i.e., an intermediary product for further processing.

The auxiliary structure may be provided at a backside of the silicon carbide substrate. The auxiliary structure may include a plurality of laterally separated metal portions. The metal portions may be formed in a multi-sectional or in a multi-piece manner. Each metal portion of the auxiliary structure may be in contact with one device region of the plurality of device regions of the silicon carbide substrate. In some embodiments, each metal portion of the auxiliary structure may be in contact with exactly one device region of the device regions. The metal portions and the device regions may be assigned to each other in a one-to-one manner.

Each device region may include a plurality of differently doped regions that constitute an electric functionality of a finalized semiconductor device obtained from the device region. Each device region may include the same functional circuit (i.e., the functional circuit may be copied along the device regions). Each device region may be connected to a front side metallization and a backside metallization of the finalized semiconductor device. For example, the backside metallization may comprise at least part of the auxiliary structure.

From each device region a dicing process results in a single semiconductor die ("chip"), wherein the semiconductor die includes a block of semiconducting material, in or on which a given functional circuit is fabricated. Before dicing, each semiconductor die forms one device region of the silicon carbide substrate.

The device regions may be arranged in a matrix. The idle region may be devoid of such elements and structures that become integral part of a semiconductor device. The idle region may include elements and structures temporarily used during wafer-level manufacturing processes and device characterization, for example, electrical test circuits and/or alignment marks. A portion of the idle region may be consumed during a dicing process. For example, a dicing process using a mechanical saw may produce scribe lines within the idle region.

The auxiliary structure may form a rigid and/or rugged and/or mechanically stabilizing carrier for the silicon carbide substrate, for example during processes applied at wafer level. Hereinafter, "mechanically stabilizing" means that the silicon carbide substrate may be handled in subsequent process acts with appropriate tools without the need for a further carrier, for example, to prevent breakage or bending of the silicon carbide substrate and/or to ease handling. In at least one method act, the auxiliary structure may be the primary mechanically stabilizing structure for the silicon carbide substrate (e.g., the only mechanically stabilizing structure). For example, the auxiliary structure may stabilize the silicon carbide substrate during and after removal of an auxiliary carrier from a front side of the silicon carbide substrate. In some embodiments, the auxiliary structure may stabilize the silicon carbide substrate during device characterization.

The device characterization (die sort and/or electrical sort) may include electric tests for each device region. For the device characterization, the silicon carbide substrate may be mounted on a chuck that may align the silicon carbide substrate to electrical probes. The electrical probes may contact at least the front side metallization. Typically, device characterization is not possible as long as an auxiliary carrier mounted at the front side of the silicon carbide substrate covers the front side metallization. Device characterization may lead to sorting out of at least some of the semiconductor devices of the silicon carbide substrate and/or of the entire silicon carbide substrate.

The auxiliary structure at the backside may mechanically stabilize the silicon carbide substrate without blocking access of the electric probes to the front side metallization. In addition, since the metal portions of the auxiliary structure are conductive, even the backside metallization is electrically accessible for device characterization.

For example, in vertical power semiconductor devices, a load current may flow in vertical direction between a first load electrode, which may form part of a front side metallization, and a second load electrode, which may form part of the backside metallization, through the semiconductor die. During device characterization, the auxiliary structure mechanically stabilizes the silicon carbide substrate during probing and allows a complete functional test of each semiconductor die on wafer level.

Since the auxiliary structure may mechanically stabilize the silicon carbide substrate up to dicing, the thickness of the silicon carbide substrate may be reduced to below 180 µm, for example, to below 110 µm, to below 90 µm or to at most 70 µm. The final thickness may depend on the diameter of the silicon carbide substrate. For example, if the silicon carbide substrate has a diameter of 6 inch, the thickness may be reduced to below 110 µm.

Since the metal portions of the auxiliary structure may be laterally separated from each other, the auxiliary structure can be used without significant impact on the complexity of a dicing process that separates individual semiconductor dies from the silicon carbide substrate.

The metal portion has a significantly lower ohmic resistivity than a highly doped semiconductor material such that the metal portion may become integral part of the finalized semiconductor device without significantly affecting device parameters such as an on-state resistance. During mechanical handling of the silicon carbide substrate, e.g., during dicing and/or during pick-and-place processes, the metal portions may reduce the occurrence of cracks and/or may reduce the risk for mechanical damage of the silicon carbide material. Mechanical damage of the silicon carbide substrate may, for example, be due to at least part of the silicon carbide substrate (e.g. edges of the silicon carbide substrate) being chipped off during mechanical handling, for example due to silicon carbide being a brittle material.

According to an embodiment providing the auxiliary structure may include providing the auxiliary structure and structurally connecting a top surface of the auxiliary structure with a backside surface of the silicon carbide substrate. That is to say, the auxiliary structure may be pre-fabricated. A structural connection may be a mechanical connection.

Pre-fabricating the auxiliary structure and then mechanically connecting the completely pre-fabricated auxiliary structure with the backside surface of the silicon carbide substrate allows forming the auxiliary structure in a separate process in a cost-effective way. Since the edge length of the device regions is typically in the range of millimeters or at least several hundred µm, an alignment of a pre-fabricated auxiliary structure relative to the device regions of the silicon carbide substrate may be comparatively simple.

According to an embodiment, the auxiliary structure may include a metal disc with a trench, wherein the trench extends from the top surface into the metal disc. The metal portions may be formed from sections of the metal disc laterally separated by the trench. In general, the sections laterally separated by the trench may be aligned relative to the device regions of the silicon carbide substrate.

The use of the word "disc" does not limit the metal disc to any specific shape. The metal disc may have an elliptical, e.g. a circular, or a polygonal, e.g. a hexagonal, cross section.

The trench may be grid-shaped. In this case, the device regions may be separated by a grid-shaped idle region. The trench may be aligned with the idle region, i.e., may at least partially overlap with the idle region.

A metal disc with a trench may be manufactured in a comparatively simple way, for example, by molding, etching, grinding and/or sawing. An auxiliary structure on the basis of a pre-fabricated metal disc may require a comparatively simple recess process as an additional process act. For example, a grinding process may be added as such an additional process act in addition to a dicing process that cuts the silicon carbide substrate into a plurality of individual semiconductor dies. That my happen after the device characterization, for example after the electrical sorting.

According to an embodiment, providing the auxiliary structure may include providing an auxiliary base. The auxiliary base may comprise laterally separated trenches, wherein the trenches may extend from the top surface of the auxiliary base into the auxiliary base. The metal portions may be formed in the laterally separated trenches.

The auxiliary base may comprise or consist of a material that may be removable with high selectivity against the metal portions or that may be easily cut. Therefore, the embodiment may add only a little to the complexity of a dicing process. For example, the auxiliary base may include a glass material, a polymer material (e.g., a resist material), and/or crystalline silicon.

According to an embodiment, structurally connecting the top surface of the auxiliary structure with the backside surface of the silicon carbide substrate may include at least one of sintering, diffusion soldering, direct bonding, or reactive bonding.

In case of direct bonding the top surface of the auxiliary structure and the backside surface of the silicon carbide substrate are sufficiently flat, smooth and clean. Adhesion between directly bonded auxiliary structure and the silicon carbide substrate may be based on chemical bonds, hydrogen bonds, metallic bonds, ionic bonds and/or covalent bonds between the silicon carbide substrate and the auxiliary structure.

Direct bonding may include exerting a physical force pressing the silicon carbide substrate and the auxiliary structure against each other, a thermal treatment of at least one of the top surface or the backside surface at moderate temperature or a combination of both (fusion bonding, thermo-compressive bonding, bonding by atomic rearrangement). Direct bonding may include the absence of any additional intermediate layer.

Diffusion soldering may include applying a diffusion solder material on at least one of the top surface of the auxiliary structure or the backside surface of the silicon carbide substrate. The diffusion solder may include tin and at least one further metal. For example, the diffusion solder may be lead-free and may include Sn and at least one of Ni, In, Pd, Mo, Cu, Au, or Ag.

Sintering may include application of a sinter paste on at least one of the top surface of the auxiliary structure or the backside surface of the silicon carbide substrate, wherein the sinter paste may include at least one of silver or copper.

Direct bonding, diffusion soldering and sintering may be performed at comparatively low temperatures such that the auxiliary structure may be provided without significant impact on previously formed structures in the silicon carbide substrate.

According to an embodiment, providing the auxiliary structure at the backside of the silicon carbide substrate may include forming a separation structure at the backside, e.g. at the backside surface, of the silicon carbide substrate.

The separation structure may have a matrix-like shape. For example, the separation structure comprises openings. The openings in the separation structure may expose the device regions. The metal portions may be formed in the openings of the separation structure.

Each device region may be exposed by one opening, wherein each device region may be completely exposed or at least 90% of each device region may be exposed.

Forming the separation structure at the backside of the silicon carbide substrate, e.g. directly on the backside surface of the silicon carbide substrate, may include an alignment process that may use alignment marks of the silicon carbide substrate or previously formed use structures in the silicon carbide substrate to bring the openings in the separation structure in alignment with the device regions at high precision.

The separation structure may be formed by a printing process or by a lithography process from organic materials e.g. imide, a resin (e.g. epoxy resin) or BCB (Benzocyclobutene, $C_8H_8$). A comparatively simple process may remove the separation structure with high selectivity against the metal portions or may easily cut through the separation structure such that the auxiliary structure may only marginally affect the complexity of a dicing process.

According to an embodiment, the method may further include dividing (e.g., sawing and/or dicing) the silicon carbide substrate and the auxiliary structure into a plurality of semiconductor dies, wherein each semiconductor die may include one or more device regions of the device regions and one or more of the metal portions. In addition, the front side metallization be divided in a plurality of front side metal portions and/or may comprise a plurality of individual front side metal portions, wherein each semiconductor die may comprise one front side metal portion of the front side metal portions.

The auxiliary structure does not add significant complexity to the process of dividing the silicon carbide substrate into separated semiconductor dies. The auxiliary structure may stabilize (e.g., mechanically stabilize) the silicon carbide substrate during a dicing process effective on the semiconductor material and may reduce the risk for the formation of cracks extending from scribe lines into the device regions. The metal portions may also reduce the risk for chipping off parts of the silicon carbide crystal along the scribe line. The metal portions increase the thickness of ultrathin semiconductor devices and therefore may simplify a pick and place process that picks the individualized semiconductor dies, e.g. from a dicing tape, and that places the semiconductor dies, e.g., on lead frames. The metal portions may protect the semiconductor portions of the semiconductor disc against chipping during a pick-and-place process.

According to another embodiment, a method of manufacturing a semiconductor device may include providing a silicon carbide substrate. Further, a front side metallization may be provided at a front side of the silicon carbide substrate and/or a backside metallization may be provided at a backside of the silicon carbide substrate.

In a further method act, a metal disc is provided. The metal disc may, for example, be provided after the front side metallization and/or after the backside metallization have been provided at the silicon carbide substrate. The metal disc and the backside metallization may be structurally connected. The metal disc may mechanically stabilize the silicon carbide substrate. For example, in at least one method act, the metal disc may form the primary mechanically stabilizing carrier of the silicon carbide substrate. Both the front side metallization and the backside metallization may be accessible for electrical sorting and/or die sort.

In general, in at least one embodiment of the methods described herein, providing a metallization (e.g., the front side metallization and/or the backside metallization) at the silicon carbide substrate may comprise at least one of sputtering, plating, or vapor deposition of a metal or a metal alloy. For example, the metallization (e.g., the front side metallization and/or the backside metallization) may comprise a plurality of metal layers, each metal layer being formed with a metal or a metal alloy, wherein directly adjoining metal layers consist of different materials or different material compositions.

According to an embodiment, an auxiliary carrier may be formed at the front side of the silicon carbide substrate. The auxiliary carrier may be formed prior to structurally connecting the auxiliary structure and/or prior to providing the backside metallization. The auxiliary carrier may further be formed after the front side metallization is provided at the front side of the silicon carbide substrate.

After forming the auxiliary carrier and prior to structurally connecting the metal disc and the backside metallization, a thickness of the silicon carbide substrate may be reduced. Reducing the thickness of the silicon carbide substrate may comprise removing part of the silicon carbide substrate, for example, by at least one of: a split-off method or mechanical removal (e.g., grinding and/or polishing). By reducing the thickness, a thin silicon carbide substrate may be obtained.

The silicon carbide substrate, the front side metallization and the backside metallization collectively may form a workpiece, i.e., an intermediary product for further processing.

The metal disc may form an auxiliary structure that may mechanically stabilize the thin silicon carbide substrate after the auxiliary carrier, which may stabilize the silicon carbide substrate during the thinning process, has been removed after the thickness reduction and prior to device characterization.

According to an embodiment, the auxiliary carrier may include a ring portion. The auxiliary carrier, in some embodiments the ring portion of the auxiliary carrier, may be bonded to the silicon carbide substrate (e.g., via the backside metallization) without an adhesive layer. That is to say, the bond between the silicon carbide substrate and the auxiliary carrier and/or the ring portion of the auxiliary carrier may be free of an adhesive layer. For example, thermal bonding may be utilized for an adhesive-layer-free bond.

According to an embodiment, prior to forming the auxiliary carrier, a front side separation trench may be formed. The front side separation trench may extend from the front side into the silicon carbide substrate. At least the semiconducting portions of semiconductor dies may be laterally separated from each other, wherein the semiconductor dies are held at the original positions within the silicon carbide substrate such that a dicing process, e.g. a mechanical sawing can be better controlled.

According to an embodiment, reducing the thickness of the silicon carbide substrate may include splitting off a layer portion of the silicon carbide substrate. Throughout this application, splitting off a layer portion of the silicon carbide substrate may also be called "split-off method". The layer portion may be reused for the manufacturing of further semiconductor devices. A plurality of thin silicon carbide substrates may be obtained from one single standard silicon carbide wafer.

In at least one embodiment, splitting off a layer portion of the silicon carbide substrate comprises the act of implanting ions into the silicon carbide substrate to form a splitting region in the silicon carbide substrate. An absorption coefficient in the splitting region is at least 5 times, or at least 20 times, higher than an absorption coefficient in the silicon carbide substrate outside the splitting region, for example for a wavelength of a laser radiation that is to be applied to the silicon carbide substrate. The method may further include the act of irradiating the silicon carbide substrate with laser radiation.

For example, the split-off method may be a laser-assisted split-off method. That is to say, the split-off method may involve applying laser radiation to the silicon carbide substrate, i.e., irradiating the silicon carbide substrate with laser radiation. The laser radiation may be applied, for example, along a splitting region of the silicon carbide substrate, in order to create thermo-mechanical stress along the splitting region, which may facilitate and/or simplify removal of the layer portion of the silicon carbide substrate.

The ion may be a layer in the silicon carbide substrate, which may have a higher absorption coefficient for the laser radiation applied to the silicon carbide substrate. In addition or as an alternative, the splitting region may be defined by focusing the laser radiation to a well-defined region in the silicon carbide substrate, which well-defined region may constitute the splitting region. In this context, "well-defined" may mean that said region has a thickness along a vertical direction of the silicon carbide substrate which is small compared to the overall thickness of the silicon carbide substrate along the vertical direction. The splitting region may, in general, have a thickness that is small compared to the thickness of the silicon carbide substrate. A lateral extent of the splitting region may be at least 90%, or at least 95%, of the lateral extent of the silicon carbide substrate. In other words, the splitting region may laterally extent substantially along the entire silicon carbide substrate.

The splitting region may comprise a different material than the rest of the silicon carbide substrate and/or may have a different crystal structure, e.g. a different poly-type, or a different crystallinity than the rest of the silicon carbide substrate. The "rest of the silicon carbide substrate" may be the part of the silicon carbide substrate that is free of the splitting region and that surrounds the splitting region. For example, the splitting region may have a different band gap (e.g., a lower band gap) than the rest of the silicon carbide substrate.

Alternatively, the splitting region may be made from the same material as the rest of the silicon carbide substrate. In the latter case, the splitting region may be primarily defined by focusing laser radiation to a well-defined region within the silicon carbide substrate.

In one example, the splitting region may be created by implanting ions into the silicon carbide substrate. The ions may result directly in higher absorption, e.g. due to higher absorption rate at the ions, and/or may lead to conversion of the crystal structure of the silicon carbide substrate into a different poly-type (e.g., from 4H—SiC to 3C—SiC) and/or into a different crystallinity, such that the absorption coefficient for the laser radiation is increased in the splitting region. For example, the absorption coefficient in the splitting region may be at least 5 times, e.g. at least 20 times or at least 100 times, higher than in the rest of the silicon carbide substrate.

The laser radiation may be in the off-resonant regime, such that a probability of single-photon processes in the splitting region is essentially zero, and mainly multi-photon processes (e.g., multi-photon absorption) may have to be taken into account. For example, the off-resonant regime may be achieved if the band gap of the splitting region is at least twice (typically at least ten times) the photon energy of the laser radiation. Applying laser radiation, e.g. by focusing the laser radiation to a well-defined region, in the off-resonant regime may result in creation of a perforation plane (which may correspond to the splitting region). In this case, the laser-assisted split-off method may also be called laser conditioning. Within the perforation plane, thermo-mechanical stress may be increased compared to the rest of the silicon carbide substrate, thus simplifying splitting the silicon carbide substrate, e.g. by applying mechanical force and/or thermal stress to the silicon carbide substrate.

As an alternative, the laser radiation may be in the resonant regime, where single-photon processes (e.g., single-photon absorption) dominate, i.e., a probability of multi-photon processes is small (e.g. at least ten times smaller than the probability of a single-photon process). In the resonant regime, the band gap of the splitting region may, for example, be at most ten times (typically at most twice) the photon energy of the laser radiation. The laser radiation may be absorbed in the splitting region and may lead to damage of the splitting region, such that no or only a small mechanical force and/or thermal stress is required for splitting the silicon carbide substrate.

In the resonant regime, the laser-assisted split-off method may also be called laser lift-off.

According to an embodiment, prior to structurally connecting the auxiliary structure and the backside metallization, a backside separation trench may be formed that extends from the backside into the silicon carbide substrate. The backside separation trench may further extend through the backside metallization. The separation of the semiconducting portions of the semiconductor dies and the cutting of the auxiliary structure can be performed independently from each other such that each cutting process can be adapted to the requirements of the material.

According to an embodiment, the metal disc may include a trench that extends from a top surface of the metal disc into the metal disc. The trench may be grid-shaped. The top surface of the metal disc may be connected with the backside metallization.

A dicing process may avoid a cut through the metal disc. Instead, a planar recess process, as, for example, grinding or mechanical polishing, may complete the dicing process.

According to another embodiment, a semiconductor device may include a silicon carbide body. The semiconductor device further includes a first load electrode at a front side of the silicon carbide body and a second load electrode at a backside of the silicon carbide body. A metal plate may be in contact with the second load electrode. A thickness of the metal plate may be at least 30 µm, for example at least 50 µm or at least 80 µm, and at most 300 µm, for example at most 200 µm or at most 180 µm. The thickness of the metal plate may be at least 20% and at most 200% of a thickness of the (already thinned) silicon carbide substrate. A load terminal may be in contact with the metal plate.

The metal plate may correspond to the metal disc or the auxiliary structure or the metal portions of the auxiliary structure described with embodiments of the methods described herein.

The metal plate comprises a metal or a metal alloy as a main material. For example, the metal plate consists of a metal or a metal alloy as a main material. Here and in the following, a component "consisting of" a material or a material composition is to interpreted such that undesired impurities, for example due to manufacturing conditions, of other materials may be present in said component.

The metal plate may stabilize the silicon carbide body at a stage of manufacturing, when a semiconductor die of the semiconductor device is part of a wafer assembly and prior to connecting the semiconductor die to a lead frame. The metal plate further facilitates device characterization and may be used to induce mechanical strain into the silicon carbide body in order to improve electrical device characteristics. According to other embodiments, the semiconductor device may include a body from another wide-bandgap material, such as gallium nitride (GaN), aluminum nitride (AlN) or gallium oxide ($Ga_2O_3$).

According to an embodiment, the silicon carbide body may include a first doped region and a second doped region, wherein the first doped region and the second doped region may form a pn junction. The first load electrode may be in contact with the first doped region. The second load electrode may be in contact with the second doped region.

According to an embodiment, the thickness of the metal plate may be greater than a thickness of the silicon carbide body between the first load electrode and the second load electrode. The thick metal plate may simplify the handling of thin semiconductor devices, e.g., semiconductor devices with a silicon carbide body thinner than 180 µm and reduces the risk for chipping and for the formation of cracks during a backend process.

According to an embodiment, the second load electrode may include one of nickel, titanium, tantalum, molybdenum, or aluminum and the metal plate may include at least one of molybdenum or copper, wherein the metal plate and the second load electrode may be connected through sintering, diffusion soldering and direct bonding in a way that does not adversely affect previously formed structures.

According to an embodiment, the semiconductor device may include a non-metal frame structure that laterally surrounds the metal plate. The non-metal frame structure may facilitate a simple, reliable and cost-effective separation of the semiconductor device from a wafer assembly.

In at least some embodiments of the methods and/or the semiconductor device, the following features (if applicable) apply, alone or in combination:
(i) the device regions are laterally separated by an idle region, for example a grid-shaped idle region;
(ii) each metal portion is in contact with exactly one of the device regions;
(iii) the auxiliary structure forms a mechanically stabilizing carrier for the silicon carbide substrate;
(iv) the metal disc forms a mechanically stabilizing carrier for the silicon carbide substrate;
(v) the silicon carbide substrate is formed from one piece;
(vi) the semiconductor device is a power semiconductor device;
(vii) a thickness of the silicon carbide body is at most 180 µm;
(viii) one metal portion of the auxiliary structure forms the metal plate of the semiconductor device;
(ix) part of the metal disc forms the metal plate of the semiconductor device;
(x) a thickness of the auxiliary structure and/or the metal portion of the auxiliary structure and/or the metal disc and/or the metal plate is at least 30 µm and/or at most 300 µm.

In the following, further embodiments of methods and semiconductor devices described herein are explained in detail in connection with the accompanying drawings.

Throughout the description of the drawings, the term "workpiece" denotes a compound of a silicon carbide substrate with a front side metallization, wherein further components, such as, for instance, a backside metallization, may be comprised by the workpiece. The person skilled in the art will appreciate that the front side metallization may be attached to the silicon carbide substrate before or after any other structure (e.g., a backside metallization, an auxiliary structure and/or a metal disc) is provided at the backside of the silicon carbide substrate.

FIG. 1 shows a method of manufacturing a semiconductor device. A workpiece is provided (902) that may include a silicon carbide substrate and a front side metallization at a front side of the silicon carbide substrate. The workpiece includes a plurality of device regions and an idle region laterally separating the device regions. An auxiliary structure is provided at a backside of the workpiece (904). The auxiliary structure includes a plurality of laterally separated metal portions. Each metal portion is in contact with one device region of the device regions.

Figure 2A:
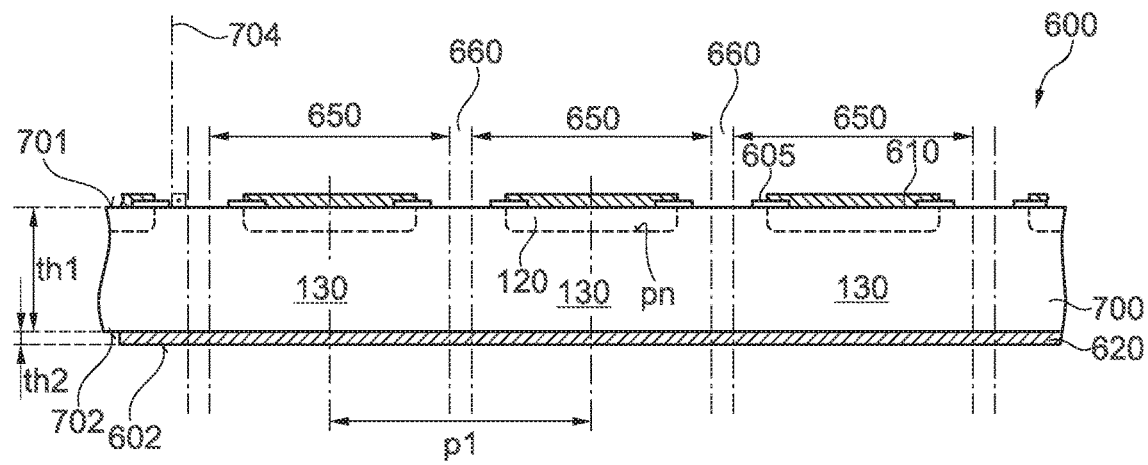
FIGS. 2A-2B show schematic cross-sectional views of a wafer assembly with a silicon carbide substrate according to an embodiment with metal portions of an auxiliary structure being in contact with device regions of a silicon carbide substrate.
Figure 2B:
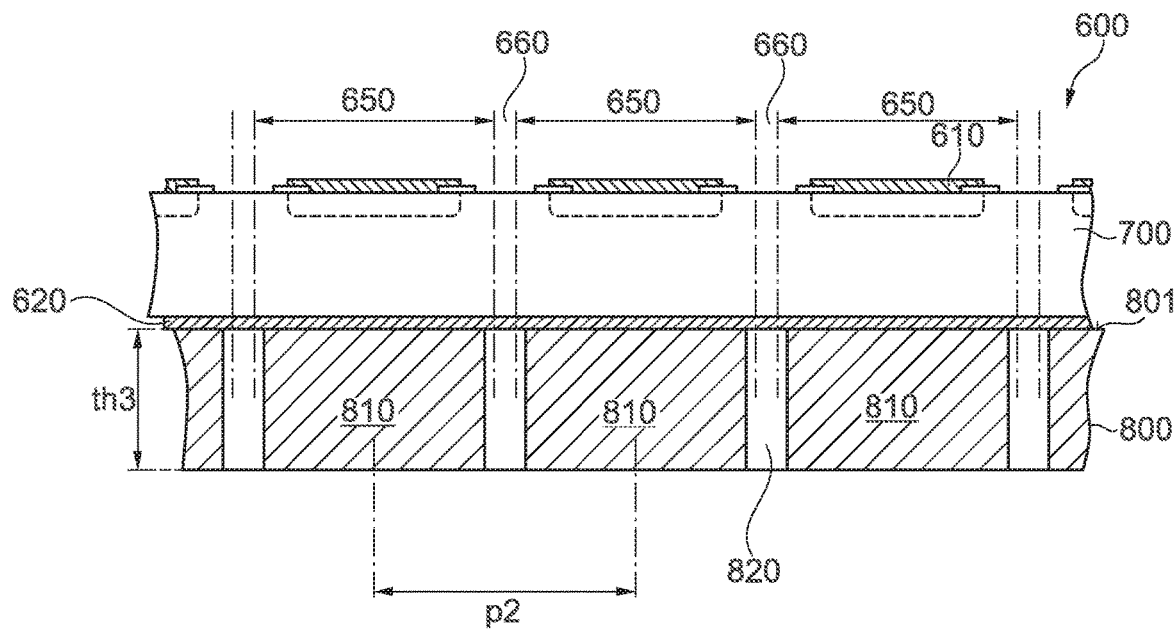

FIGS. 2A-2B are related to a method that includes forming an auxiliary structure with laterally separated metal portions 810.

FIG. 2A shows a workpiece 600, wherein the workpiece 600 includes a silicon carbide substrate 700 and a front side metallization 610 at a front side of the silicon carbide substrate 700. Other embodiments may relate to a workpiece 600 with a substrate based on another wide-bandgap semiconductor material, e.g., GaN, AlN or $Ga_2O_3$.

The silicon carbide substrate 700 may be a flat disc with a diameter corresponding to the diameter of a standard wafer size, for example, 2-inch (51 mm), 3-inch (76 mm), 4-inch (100 mm), 125 mm, or 200 mm. The silicon carbide substrate 700 may be based on a silicon carbide crystal including silicon and carbon as main constituents. The silicon carbide crystal may include further materials, for example, unintentional impurities as a result of material and process imperfections and/or intentional additives. Unintentional impurities may include carbon and/or oxygen. Intentional additives may include hydrogen and/or dopant atoms, e.g., nitrogen (N), phosphorus (P), beryllium Be), boron (B), aluminum (Al), and/or gallium (Ga). A surface normal 704 on a main surface 701 at a front side of the silicon carbide substrate 700 defines a vertical direction. Directions orthogonal to the surface normal 704 are lateral or horizontal directions.

A thickness th1 of the silicon carbide substrate 700 between the main surface 701 and a backside surface 702 of the silicon carbide substrate 700 may be equal to or smaller than a thickness of a standard wafer for the same diameter. For example, the thickness th1 may be smaller than 180 µm, smaller than 110 µm, smaller than 90 µm, or at most 70 µm.

The workpiece 600 may include further structures and/or elements, for example, a backside metallization 620 in contact with the backside surface 702 of the silicon carbide substrate 700. An interlayer dielectric 605 may be formed between portions of a front side metallization 610 and portions of the silicon carbide substrate 700. A passivation structure may cover edge portions of the front side metallization 610 and/or the interlayer dielectric 605.

An auxiliary carrier may be formed at the front side of the workpiece 600. The auxiliary carrier may include a main carrier (such as, e.g., a glass carrier or a semiconductor wafer, such as a silicon wafer) and an adhesive layer bonding the main carrier onto the front side of the workpiece 600.

The workpiece 600 includes a plurality of device regions 650 and a grid-shaped idle region 660. The device region 650 may be arranged in a matrix of rows and columns. The idle region 660 laterally separates the device regions 650. Each device region 650 may include a plurality of doped regions formed in the silicon carbide substrate 700.

For example, each device region 650 may include a first doped region 120, e.g., an emitter region, and a second doped region 130, e.g., a drift structure. The first doped 120 region and the second doped region 130 may form a pn junction pn.

The first doped region 120 and a portion of the front side metallization may form a low-resistive ohmic contact. In other embodiments, however, the front side metallization may form a Schottky contact with at least one doped region of the silicon carbide substrate. The first doped region 120, e.g. embodied as an emitter region, may include an anode region of a power semiconductor diode or may include body regions of an IGFET (e.g., a MOSFET), MCD (MOS-controlled diode) or IGBT (insulated gate bipolar transistor).

The drift structure and a portion of the backside metallization 620 may form a low-resistive ohmic contact. The drift structure may include a lightly doped drift layer, wherein a thickness of and a dopant concentration in the drift layer are selected to accommodate a given blocking voltage.

The idle region 660 may include a portion of the silicon carbide substrate 700 and a portion of the backside metallization 620. The front side metallization 610 may be a continuous structure or may include a plurality of separated metallization portions, wherein each metallization portion is formed in one or more device regions of the device regions 650.

The backside metallization 620 may include one layer including one or more main constituents or may include two or more sub-layers, wherein the sub-layers have different main constituents. For example, the backside metallization 620 may include a nickel layer, a silver layer, a nickel silicide layer, a titanium layer and/or an aluminum layer.

A thickness th2 of the backside metallization 620 may be in a range from 200 nm to 5000 nm. The backside metallization 620 may be deposited on the silicon carbide substrate 700 by means of sputtering, plating and/or vapor deposition. The backside metallization 620 may comprise a layer stack with a plurality of layers. Each layer may consist of a metal or a metal alloy. The outermost layer of the backside metallization 620 (i.e., the layer that forms an outer surface of the backside metallization 620) may consist of Cu or AuSn or may comprise these materials. After depositing the backside metallization 620, the backside metallization 620 may be planarized, e.g. via chemical mechanical polishing (CMP). This may lead to improved surface quality with respect to wire bonding to the backside metallization 620 (e.g., wire bonding to the outermost layer).

An auxiliary structure 800 is provided at the backside of the workpiece 600. The auxiliary structure 800 may be pre-fabricated and then structurally connected with the workpiece 600, e.g., by bonding, sintering, and/or diffusion soldering. Alternatively, the auxiliary structure 800 may be formed stepwise directly on a backside surface 602 of the workpiece 600.

FIG. 2B shows a wafer assembly that includes the workpiece 600 and the auxiliary structure 800. A top surface 801 of the auxiliary structure 800 is in direct contact with the backside surface 602 of the workpiece 600, wherein the backside surface 602 may include an exposed surface of the backside metallization 620.

The auxiliary structure 800 includes a plurality of metal portions 810. The metal portions 810 may include at least one of copper, silver, tungsten, or molybdenum as main constituent(s). In a typical embodiment, copper or molybdenum may be used. At least a section of the metal portions 810 along the top surface 801 may include atoms of a sinter paste and/or atoms of a diffusion solder.

A center-to-center distance p2 between neighboring metal portions 810 may be equal to a center-to-center distance p1 between neighboring device regions 650. A thickness th3 of the metal portions 810 may be in a range from 30 μm to 200 μm, e.g., in a range from 80 μm to 120 μm.

A grid-shaped separation structure 820 may laterally separate the metal portions 810 from each other. The separation structure 820 may include a void and/or may include a conductive or dielectric auxiliary material. According to an embodiment, the separation structure 820 may include, e.g., a glass, a resin, and/or a silicon.

In the wafer assembly of FIG. 2B the auxiliary structure 800 may mechanically stabilize an ultrathin silicon carbide substrate 700 and at the same time may facilitate electrically contacting conductive structures on both sides of the workpiece 600 with electric probes, for example for electrical tests for device characterization.

FIGS. 3A to 4C relate to embodiments with pre-fabricated auxiliary structures 800. For example, an auxiliary structure 800 may be formed with a grid-shaped trench 805 that extends from a top surface 801 of the auxiliary structure 800 into the auxiliary structure 800. An auxiliary structure 800 with grid-shaped trench 805 may formed by molding using an appropriate mold. Alternatively, the trench 805 may be formed in the top surface 801 of a flat metal disc, e.g., by etching and/or sawing.

Figure 3A:
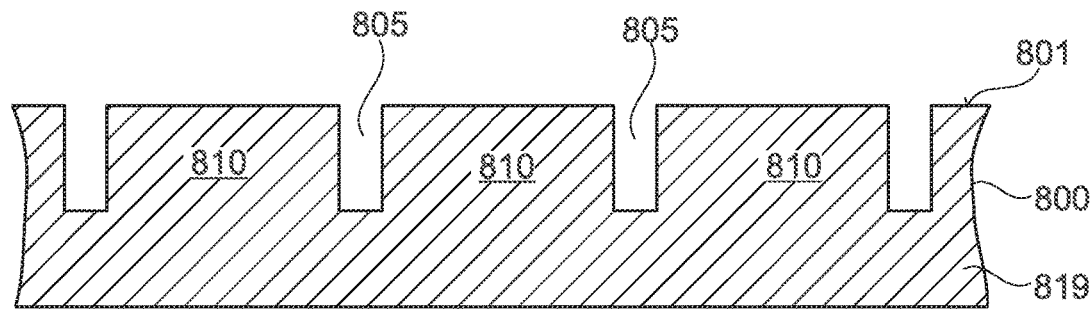
FIGS. 3A-3C show schematic cross-sectional views of an auxiliary structure and a wafer assembly with a silicon carbide substrate according to an embodiment related to an auxiliary structure based on a metal disc with a grid-shaped trench.

FIG. 3A shows a pre-fabricated auxiliary structure 800 with laterally separated metal portions 810. A continuous metal base 819 may connect the metal portions 810 and may hold the metal portions 810 at their positions relative to each other.

A process including at least one of direct bonding, diffusion soldering, or sintering mechanically connects a top surface of the metal portions 810 with a backside surface 602 of the workpiece 600, e.g., with the backside metallization 620.

Figure 3B:
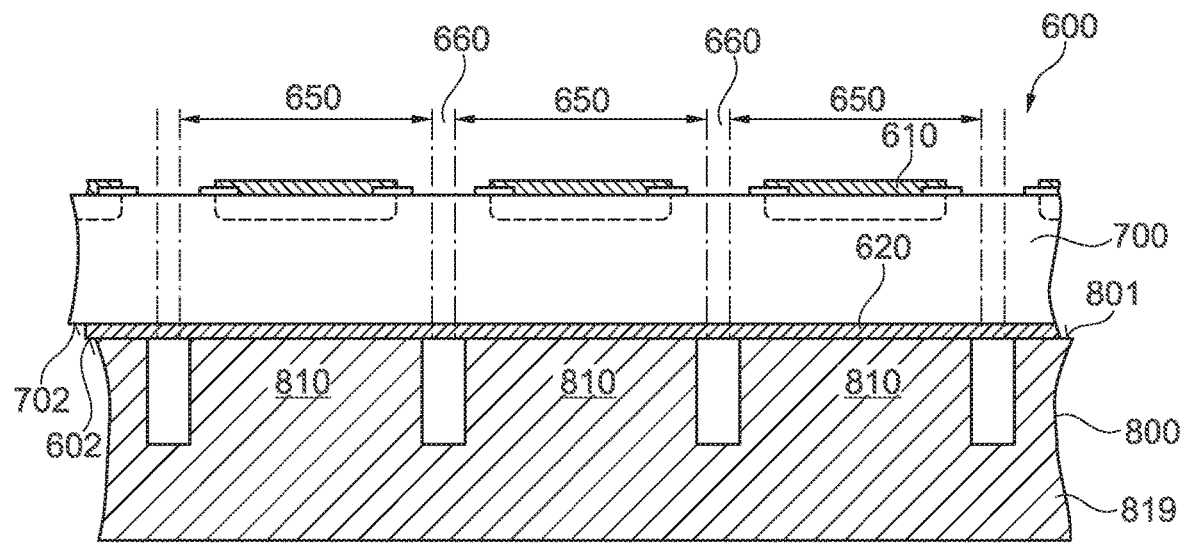
Figure 3C:
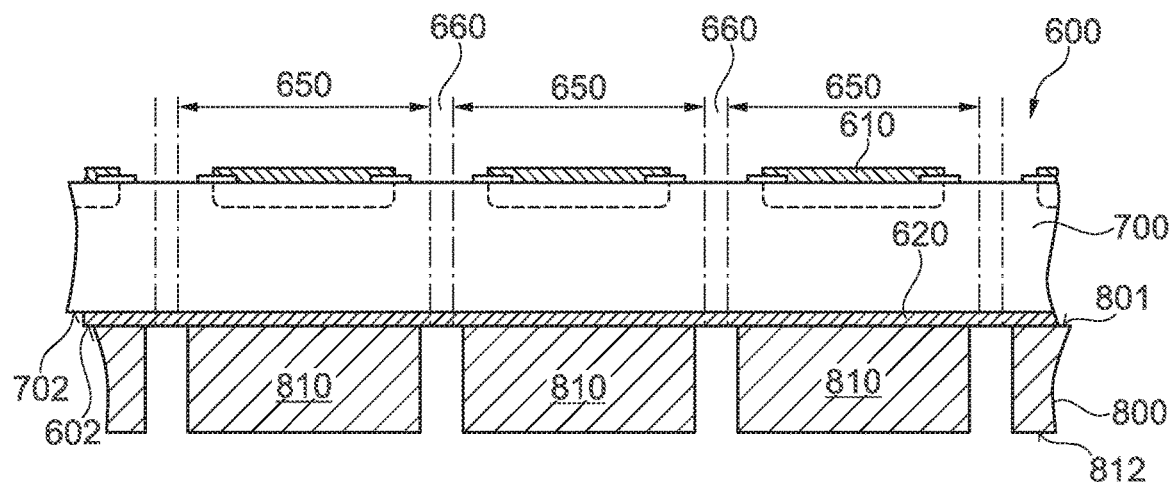

The wafer assembly shown in FIG. 3B includes a workpiece 600 as described with reference to the previous figures and the pre-fabricated auxiliary structure 800 of FIG. 3A. A device characterization may electrically probe the silicon carbide substrate 700.

A dicing process may separate the device regions 650 along separation lines in the idle region 660, wherein each device region 650 separated from the wafer assembly forms a semiconductor die of a single semiconductor device. The dicing process may include a cutting or sawing process for vertically cutting through both the silicon carbide substrate 700 and the backside metallization 620.

Alternatively, the dicing process may include a recess process that removes the continuous metal base 819, e.g., by grinding, etching, and/or by chemical-mechanical polishing, wherein the continuous metal base 819 may be removed before or after cutting through the workpiece 600. In case the continuous metal base 819 is removed after cutting through the workpiece 600, a reversible carrier (e.g., a tape, such as a grinding tape) may be bonded and/or adhered to the front side of the workpiece 600 prior to removing the continuous metal base 819. Alternatively, a combined sawing process may cut through both the workpiece 600 and through the continuous metal base 819 of the auxiliary structure 800.

Figure 4A:
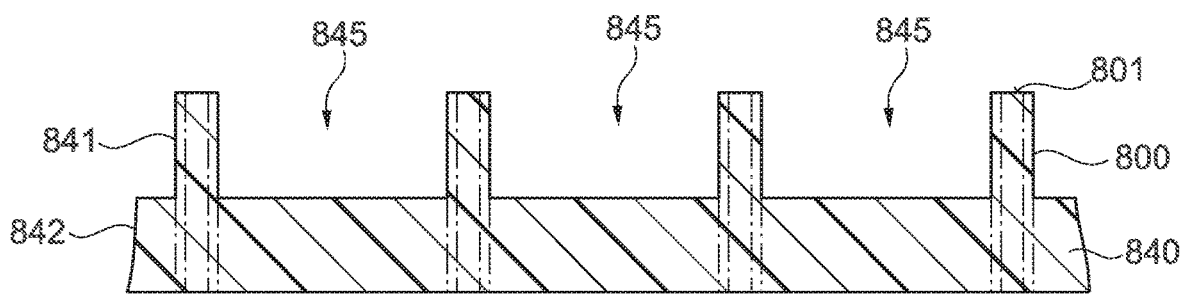
FIGS. 4A-4C show schematic cross-sectional views of an auxiliary structure and a wafer assembly with a silicon carbide substrate according to an embodiment, wherein metal portions of an auxiliary structure are formed in trenches of a non-metal auxiliary base.
Figure 4B:
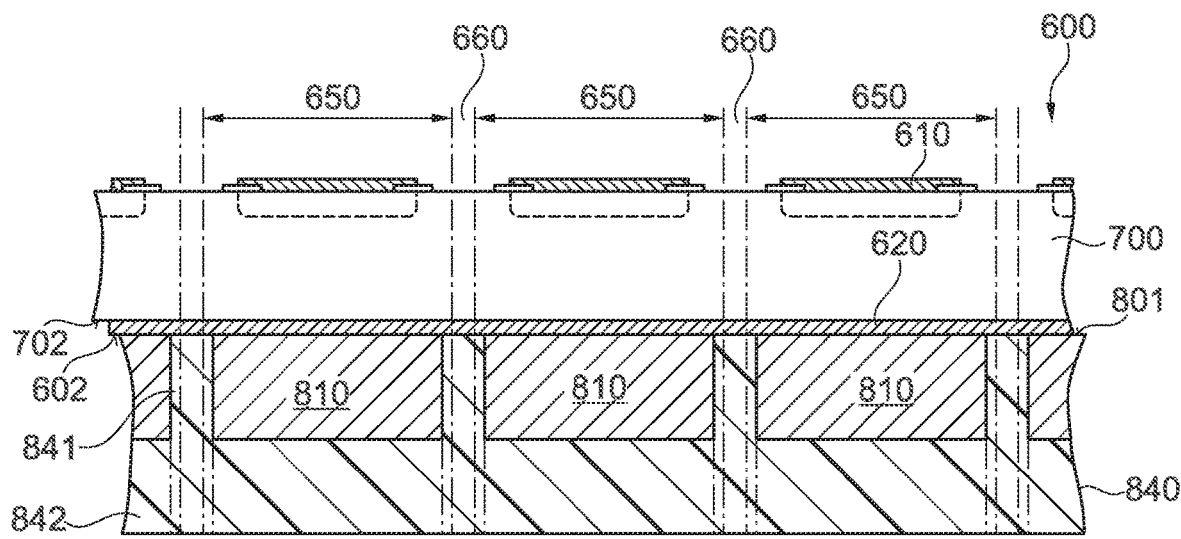
Figure 4C:
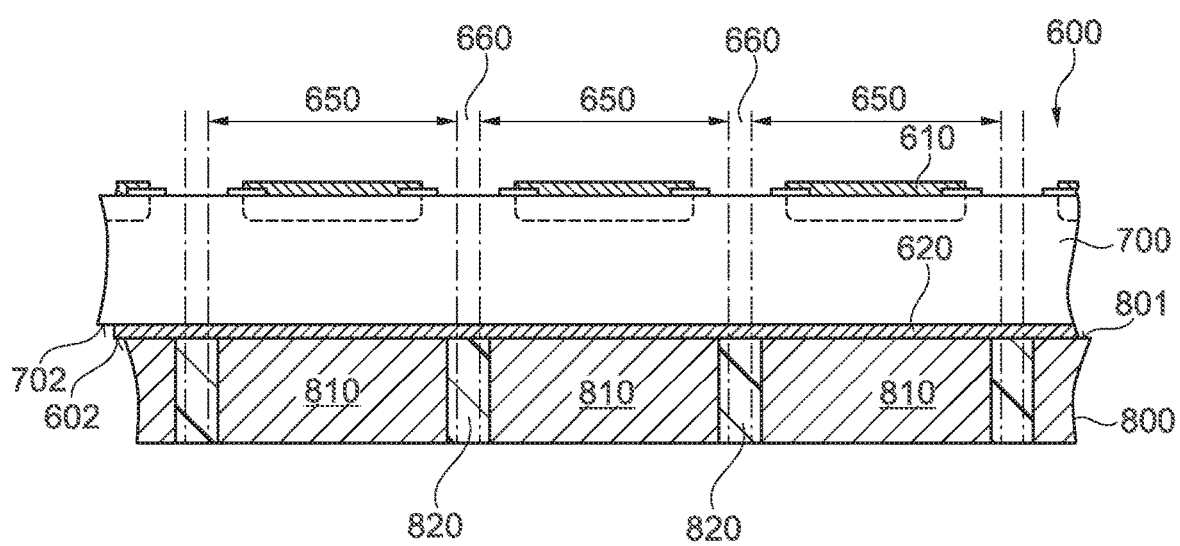

In FIGS. 4A-4C an auxiliary structure 800 is pre-fabricated by forming a plurality of laterally separated trenches 845 in a top surface 801 of an auxiliary base 840.

FIG. 4A shows the auxiliary base 840 with laterally separated trenches 845 extending from the top surface 801 into the auxiliary base 840. The material of the auxiliary base 840 may show high etch-selectivity against the metal portions 810 and/or may be easily cut through in course of a mechanical dicing process. The auxiliary base 840 includes a continuous portion 842 and a matrix portion 841 between the top surface 801 and the continuous portion. The matrix portion 841 forms a grid and laterally separates the trenches 845.

A metal may be deposited on the front side of the auxiliary base 840. Deposition of the metal may include galvanic deposition or coating using a squeegee (German: Rakel) An auxiliary structure 800 including the auxiliary base 840 is mechanically connected 800 on a backside surface 602 of a workpiece 600, e.g., on the backside metallization 620, by direct bonding, diffusion soldering, or sintering.

FIG. 4B shows a wafer assembly that includes an auxiliary structure 800 and a workpiece 600 as described with reference to FIGS. 2A and 2B. The auxiliary structure 800 includes the auxiliary base 840 of FIG. 4A and metal portions 810 formed from metal deposited in the laterally separated trenches 845 of the auxiliary base 840 of FIG: 4A. The continuous portion 842 of the auxiliary base 840 may be removed.

FIG. 4C shows the wafer assembly after removal of the continuous portion 842. The auxiliary structure 800 includes the metal portions 810 and a separation structure 820 formed from the matrix portion 841 of FIG. 4B. The wafer assembly allows device characterization and dicing, wherein the auxiliary structure may permanently stabilize the silicon carbide substrate 700.

Figure 5A:
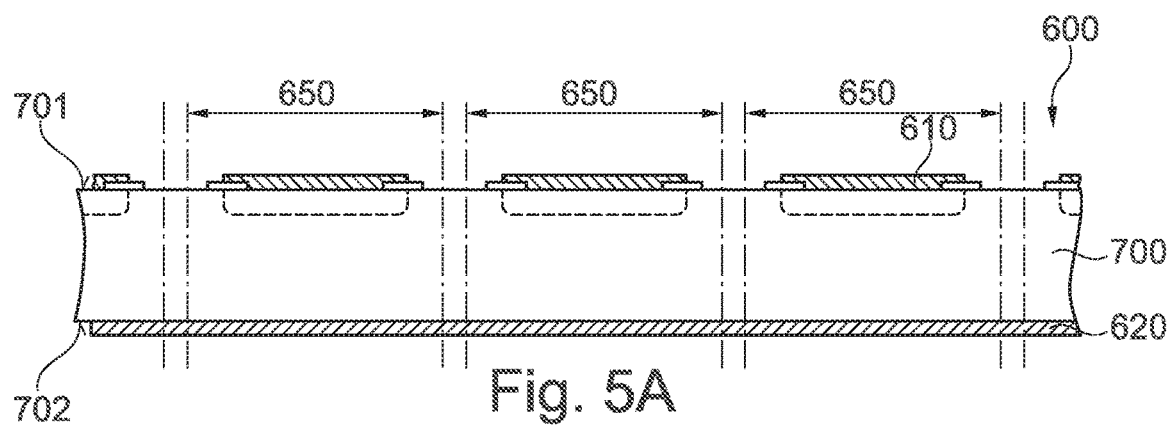
FIGS. 5A-5C show schematic vertical cross-sectional views of a wafer assembly with a silicon carbide substrate according to an embodiment, wherein metal portions of an auxiliary structure are formed in openings of a matrix-like separation structure at a backside of a workpiece with a silicon carbide substrate.
Figure 5B:
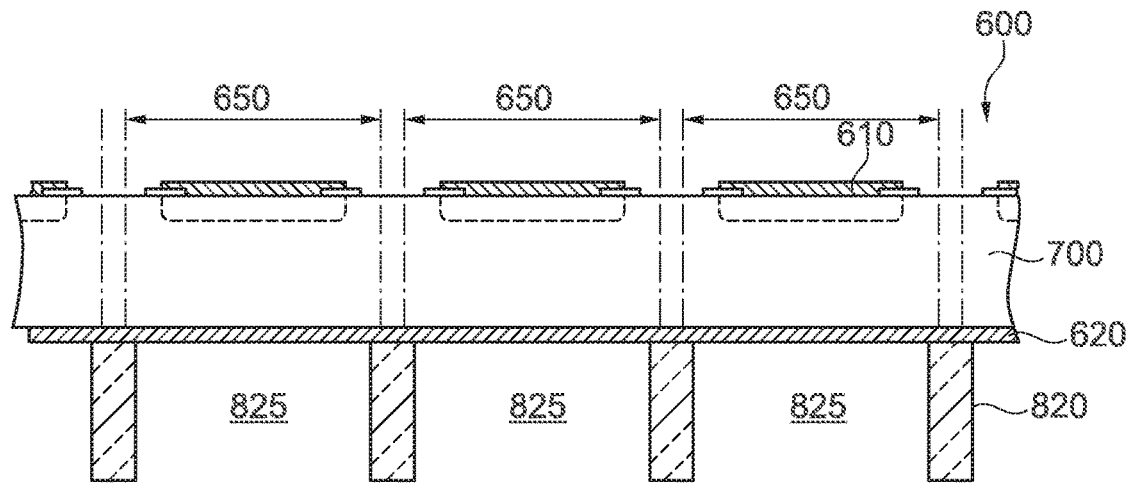
Figure 5C:
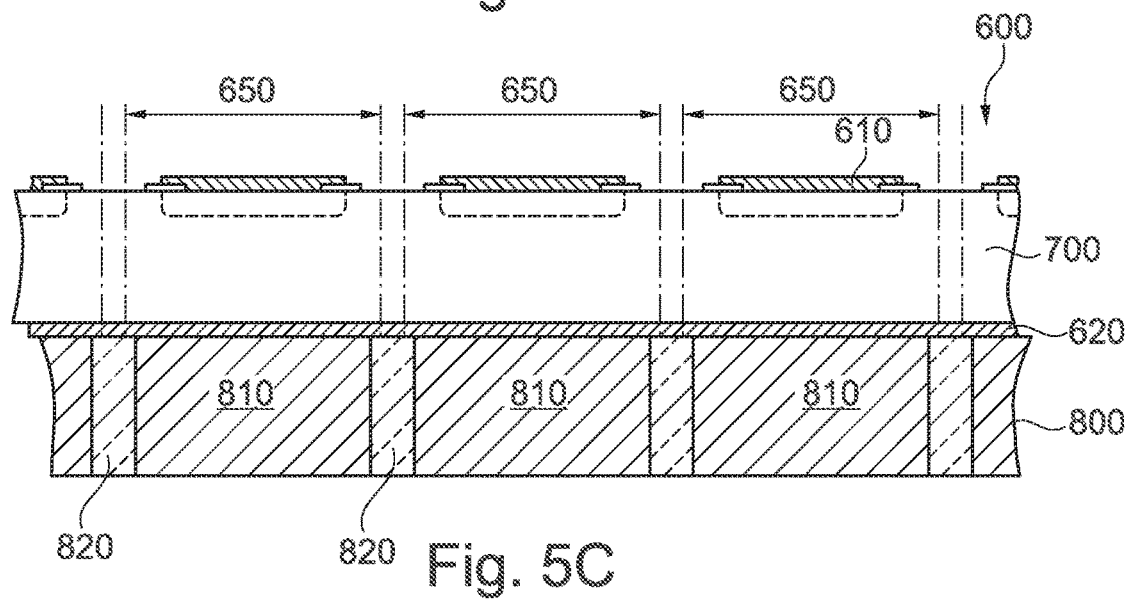

FIGS. 5A to 5C show stepwise formation of an auxiliary structure 800 on a backside surface 602 of a workpiece 600.

FIG. 5A shows a workpiece 600 as described with reference to FIG. 2A. A grid-shaped separation structure 820 may be formed on the backside surface 602 of the workpiece 600. Forming the separation structure 820 may include a printing process or a lithography process. For example, an imide, a resin (e.g., an epoxy resin) or BCB may be printed, e.g. stencil printed, onto the workpiece backside surface 602. Alternatively, a layer, e.g., a resist layer or a glass layer may be deposited on the backside surface 602 and a lithography process may pattern the deposited layer to form the separation structure 820 from portions of the deposited layer.

As illustrated in FIG. 5B the separation structure 820 may form a matrix that includes openings 825. Each opening 825 exposes at least a large portion, e.g. at least 90% of one device region 650. Each device region 650 may be exposed by one opening 825. Each device region 650 may be completely exposed.

Metal portions 810 may be formed in the openings 825 of the separation structure 820. For example, a metal paste may be coated with a squeegee, wherein excess metal paste may be removed. A baking process may dry the metal paste to form solid metal paste. Alternatively or in addition, forming the metal portions 810 may include a printing process or electrochemical or electroless deposition of a metal.

FIG. 5C shows a wafer assembly after formation of an auxiliary structure 800 that includes the separation structure 820 and the metal portions 810 in the openings 825 of FIG. 4B. The wafer assembly allows electric probing at both the front side and the backside of the workpiece 600. A comparatively simple process may remove the separation structure 820 with high selectivity against the metal portions 810 or may easily cut through the separation structure 820 such that the auxiliary structure 800 may have a low impact on the complexity of a dicing process.

FIGS. 6A-6J illustrate a method of manufacturing a semiconductor device, wherein the method combines the use of an auxiliary structure 800 as described with reference to FIGS. 2A-5C with a wafer split method.

A silicon carbide substrate 700, which may have the diameter and the thickness of a standard silicon carbide wafer, may be processed, wherein doped regions of electronic components are formed in the silicon carbide substrate 700.

According to an embodiment, a splitting region 750 may be formed in the silicon carbide substrate 700. The splitting region 750 may be a damage layer. For example, ions, (e.g. N, V, B, Ar, C, Ni, Si, Ti, Ta, Mo, W and/or Al) may be implanted into the silicon carbide substrate 700 through the main surface 701 or through the backside surface 702 of the silicon carbide substrate 700. The ions may be implanted in a silicon carbide wafer of the silicon carbide substrate 700. The implanted ions may damage and/or result in altering of the crystal lattice of the silicon carbide substrate 700 in a thin layer around an end-of-range peak of the implant. For example, due to the implantation of ions, at least part of the poly-type of the silicon carbide substrate 700 in the splitting region 750 may change, e.g. from 4H—SiC to 3C—SiC. The splitting region 750 may have a higher absorption coefficient than the surrounding rest of the silicon carbide substrate 700. The absorption coefficient may be the absorption coefficient for the wavelength of the laser radiation that is to be applied to the silicon carbide substrate 700. The splitting region 750 may have a thickness of at least 30 nm, typically at least 100 nm, and at most 1.5 µm, typically at most 500 nm.

Prior to or after removing the splitting region 750 first doped regions 120 may be formed by implanting doped atoms. In one example, the first doped regions 750 may be formed after removal of a layer portion of the silicon carbide substrate 700.

Figure 6A:
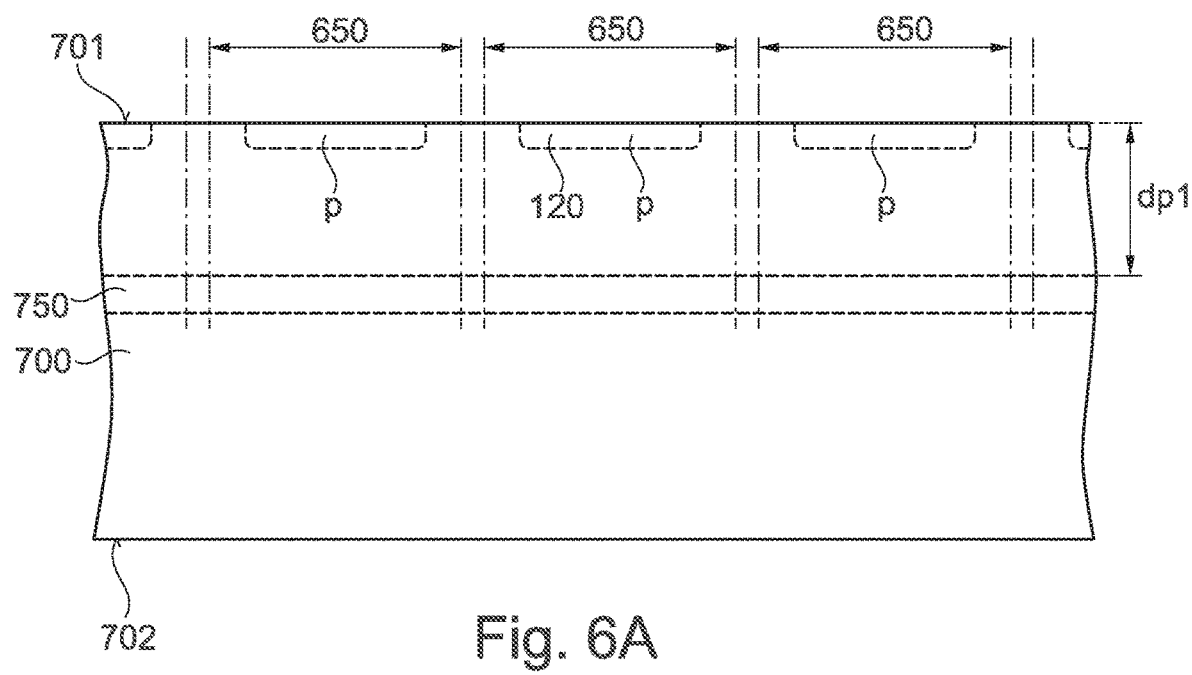
FIGS. 6A-6J show schematic vertical cross-sectional views of a wafer assembly with a silicon carbide substrate, an auxiliary structure and an auxiliary carrier according to a further embodiment.

FIG. 6A shows the splitting region 750 at a distance dp1 to the main surface 701. The distance dp1 may be greater than a thickness of a semiconductor body of the finalized semiconductor device. In this example, a plurality of first doped regions 120 is formed between the main surface 701 and the splitting region 750. In other examples, however, which are not shown in FIG. 6A, the plurality of first doped regions 120 may be formed after removal of a layer portion of the silicon carbide substrate 700 below the splitting region 750.

An interlayer dielectric 605 and a front side metallization 610 may be formed on a main surface 701 at a front side of the silicon carbide substrate 700. The front side metallization 610 may be in contact with the first doped regions 120 in the silicon carbide substrate 700. Portions of the interlayer dielectric 605 may be formed between portions of the front side metallization 610 and the main surface 701. A passivation structure 615 may be formed. The passivation structure 615 may cover edges of the front side metallization 610.

Figure 6B:
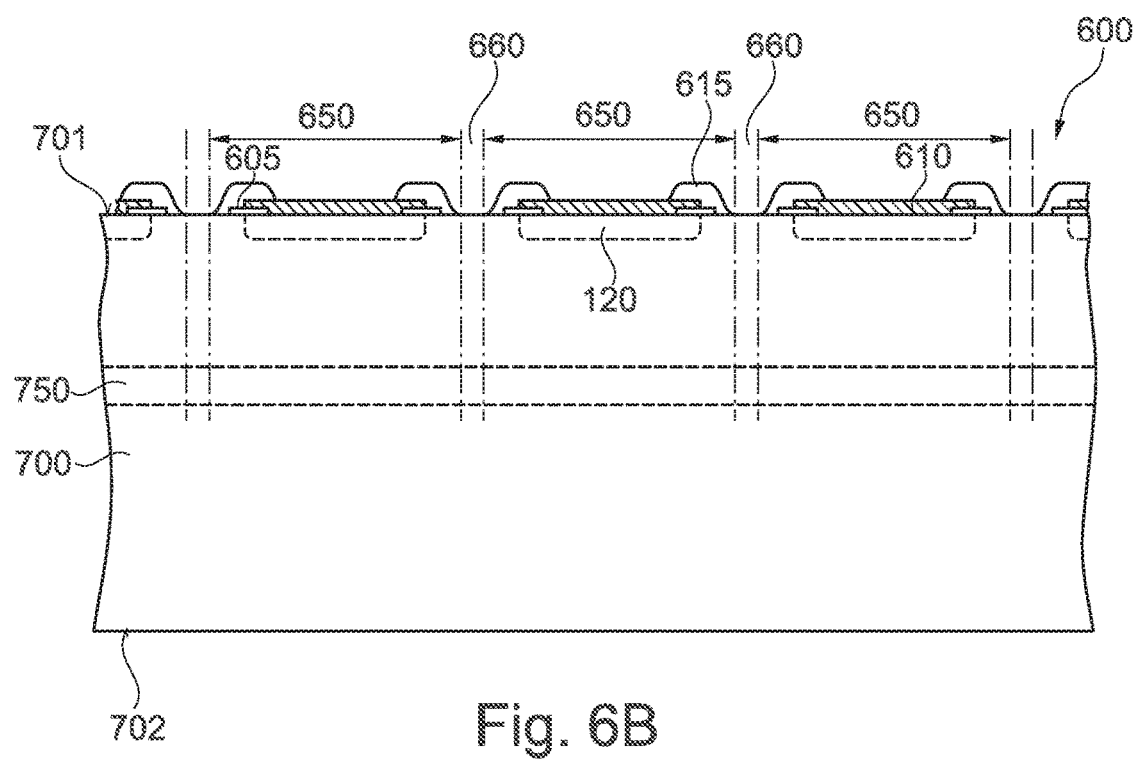

FIG. 6B shows a workpiece 600 including the silicon carbide substrate 700 and a front side construction that may include at least the front side metallization 610, the interlayer dielectric 605 and the passivation structure 615. The workpiece 600 may include a plurality of device regions 650, wherein each device region 650 includes the same pattern of doped regions and the same front side construction. An idle region 660 laterally separates the device regions 650. In a plan view of the main surface 701, the idle region 660 may be grid-shaped and the device regions 650 may be formed in rectangular meshes of the grid-shaped idle region 660.

According to an embodiment related to a dicing-before-grinding approach, a front side separation trench 705 may be formed in the idle region 660. A width of the front side separation trench 705 may be equal to or smaller than a width of the idle region 660. A depth dp2 of the front side separation trench 705 may be equal to or greater than a thickness of a semiconductor body of the finalized semiconductor device. Forming the front side separation trench 705 may include an etch process, a mechanical sawing process, or a laser-based sawing process, by way of example.

The front side separation trench 705 may expose the splitting region 750 or may be formed such that the front side separation trench 705 does not expose the splitting region 750.

Figure 6C:
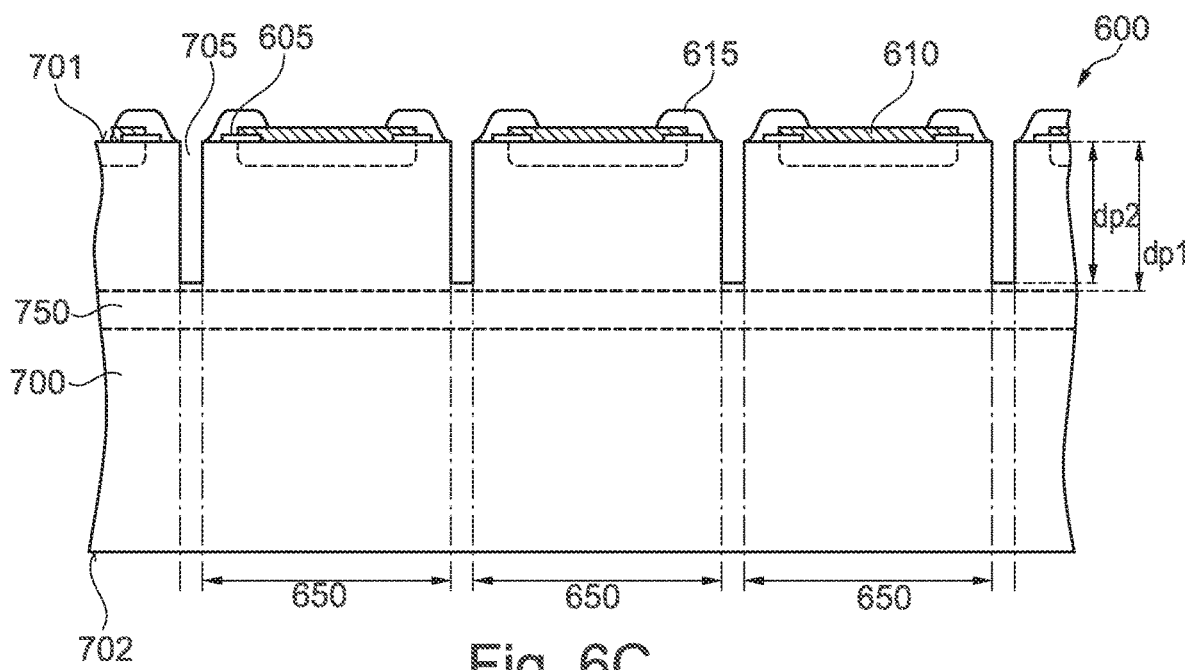

FIG. 6C shows the front side separation trench 705 extending from the main surface 701 into the silicon carbide substrate 700. In the illustrated embodiment the depth dp2 of the front side separation trench 705 is smaller than the distance dp1 between the main surface 701 and the splitting region 750.

An auxiliary carrier 680 may be attached to the front side of the workpiece 600. For example, an adhesive layer 681 may adhesion bond a main carrier 682 at the front side of the workpiece 600. The adhesive layer 681 may be formed from a temporary bonding/debonding adhesive. For example, liquid glue may be applied onto the front side, wherein the glue may fill the front side separation trench 705. A pre-bake may dry the glue and/or remove a solvent. The main carrier 682 may be brought into contact with an exposed top surface of the dried glue. The dried glue may be cured, for example, through illumination with ultraviolet radiation to form the adhesive layer 681. According to another example, the adhesive layer 681 may be an adhesive tape that adhesion bonds the main carrier 682 and the workpiece 600.

Figure 6D:
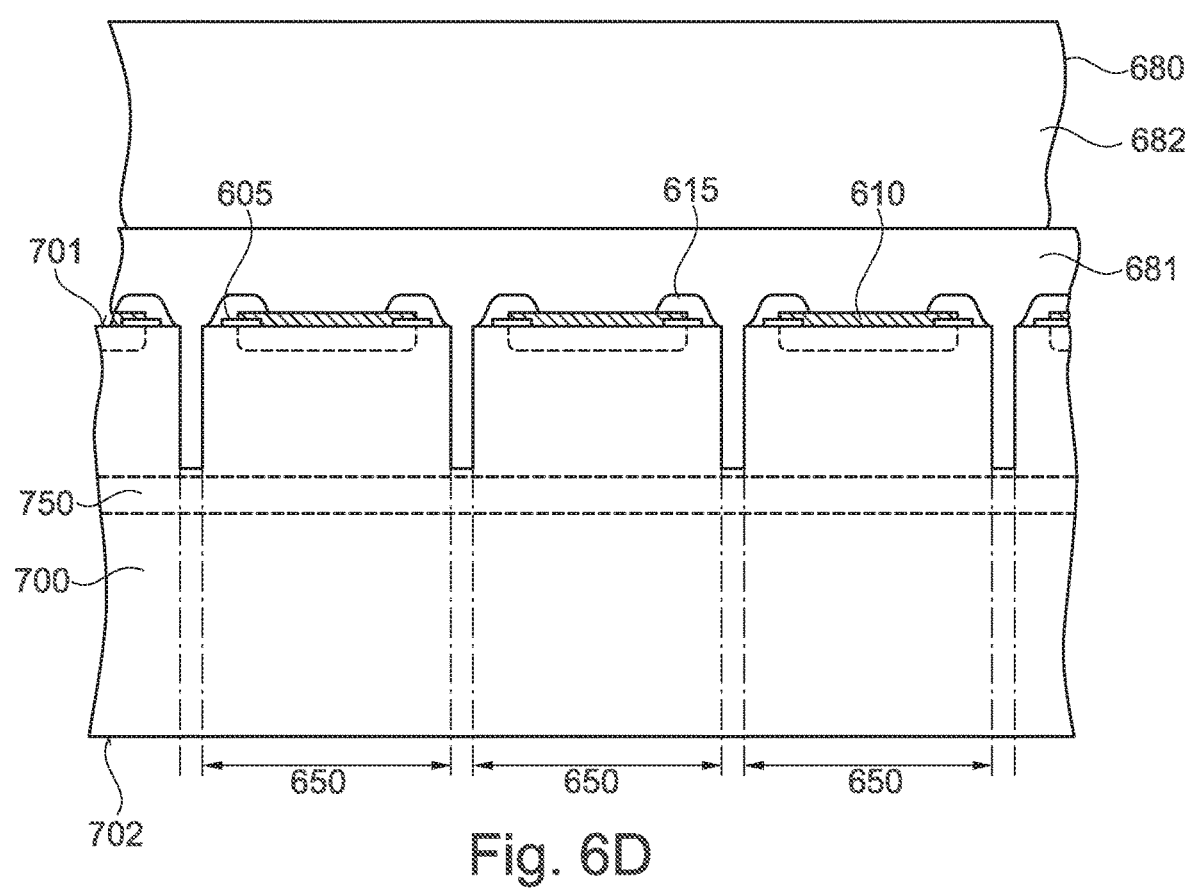

FIG. 6D shows the adhesive layer 681 and the main carrier 682. The main carrier 682 may be or may include a transparent or non-transparent support (e.g. a glass carrier or a silicon wafer). The adhesive layer 681 may include a cured adhesive material, wherein the adhesive material may be curable under radiation, for example, under ultraviolet radiation. For example, the adhesive layer may include an acrylate polymer, a synthetic rubber and/or silicone.

A thickness of the silicon carbide substrate 700 may be reduced, for example, by a wafer split-off method, typically a laser-assisted split-off method using the splitting region 750. For example, laser radiation (e.g. with a wavelength of at least 300 nm and at most 600 nm) may be applied to the silicon carbide substrate 700. The laser radiation may be at least partially absorbed in the splitting region 750, thus resulting in decomposition and/or destruction of at least part of the splitting region 750. The silicon carbide substrate 700 may then be split by applying mechanical force and/or stress to the silicon carbide substrate 700.

In addition or as an alternative, a heating treatment may induce a reallocation of the implanted ions, wherein pores may form in the splitting region 750 and moderate mechanical force may split off a layer portion along a horizontal plane through the splitting region 750.

According to another embodiment the silicon carbide substrate 700 may be ground or chemically mechanically polished, wherein forming the splitting region 750 can be omitted.

Figure 6E:
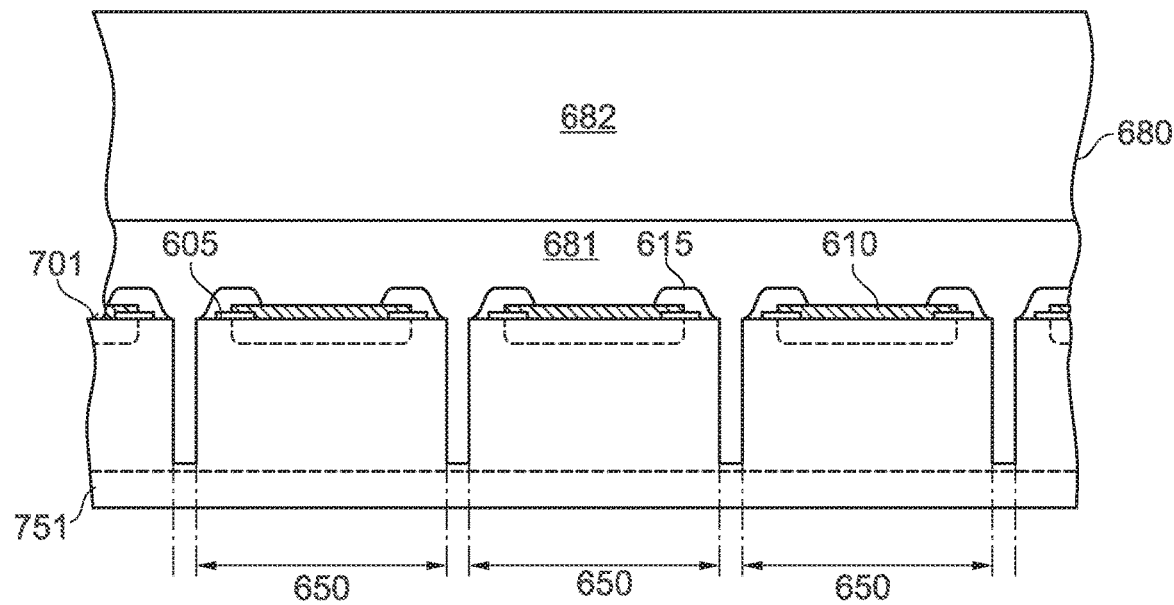

FIG. 6E shows a wafer assembly with the thinned silicon carbide substrate 700 that may include a remaining portion 751 of the splitting region 750 of FIG. 6D. A backside processing of the silicon carbide substrate 700 may be continued. Backside processing may include a mechanical polishing that removes the remaining portion 751 of the splitting region 750 and that may expose the front side separation trench 705.

In case the depth dp2 of the front side separation trench 705 is sufficiently small such that the removal of the remaining portions 751 of the splitting region 750 does not expose the front side separation trench 705, backside processing may be unaffected from the adhesive material in the front side separation trench 705.

Backside processing may include forming a heavily doped contact portion 139 along the backside surface 702 of the silicon carbide substrate 700, wherein a dopant concentration in the contact portion 139 is sufficiently high to form an ohmic contact with a metal. For example, a nickel silicide or a mixture of nickel and silicon may be deposited onto the backside surface 702 of the silicon carbide substrate 700 and a heat treatment may transform the deposited nickel and silicon atoms into the heavily doped contact portion 139. According to another embodiment, an implant process may form a doped layer along the backside surface 702 of the silicon carbide substrate 700, wherein a heat treatment may activate the implanted dopants by integrating the implanted atoms at lattice sites of the silicon carbide crystal.

The heat treatment may include local irradiation of the backside surface 702 of the silicon carbide substrate 700 such that structures previously formed at the front side of the silicon carbide substrate 700 may remain unaffected. A backside metallization 620 may be formed on the backside surface 702 of the silicon carbide substrate 700 prior to or after the heat treatment for forming the contact portion 139.

Figure 6F:
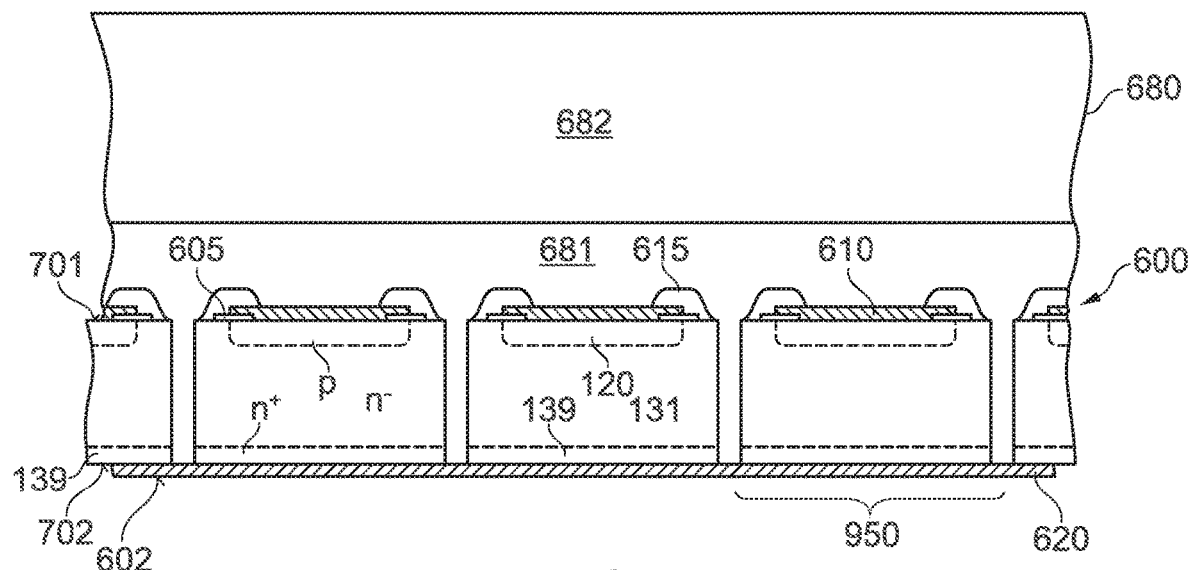

In the wafer assembly illustrated in FIG. 6F, the workpiece 600 includes a plurality of semiconductor dies 950 connected through the backside metallization 620, wherein each semiconductor die 950 includes all features of a device region 650 of FIG. 6E in combination with a completed backside structure. The completed backside structure may include the heavily doped contact portion 139 and a portion of the backside metallization 620. The auxiliary carrier 680 and the continuous backside metallization 620 hold the semiconductor dies 950 at the position of the device regions 650 of FIG. 6E.

An auxiliary structure 800 is provided on the backside surface 602 of the workpiece 600 according to any of the embodiments described in detail with reference to FIGS. 2A to 5C.

For example, a sinter paste that may include silver and/or copper may be applied to at least one of the top surface 801 of the auxiliary structure 800 or the backside surface 602 of the workpiece 600. The sinter paste may be baked such that the sinter paste loses its solvents. A top surface 801 of the auxiliary structure 800 may be brought into contact with the backside surface 602 of the workpiece 600.

A pre-sintering may temporary stabilize a mechanical connection between the auxiliary structure 800 and the workpiece 600 sufficiently such that the auxiliary carrier 680 can be removed from the front side without that the auxiliary structure 800 separates from the workpiece 600.

Figure 6G:
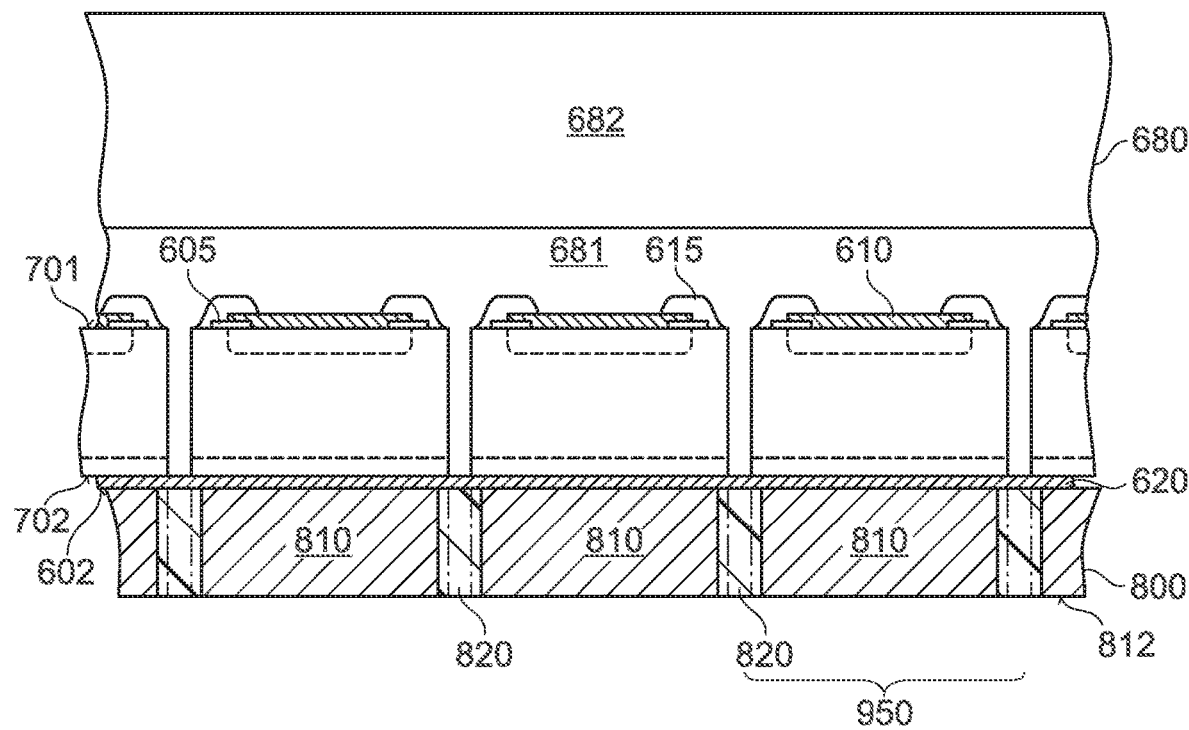

As illustrated in FIG. 6G the auxiliary structure 800 is in contact with a backside surface 602 of the workpiece 600. The auxiliary structure 800 may include a separation structure 820 laterally separating a plurality of metal portions 810. Each metal portion 810 is in direct contact with one device region of the device regions 650.

A laser may locally heat the adhesive layer 681 to remove the main carrier 682 from the workpiece 600. A protection foil 690 that may be temperature resistant up to a temperature of at least 270° C. may be applied to the front side of the workpiece 600.

Figure 6H:
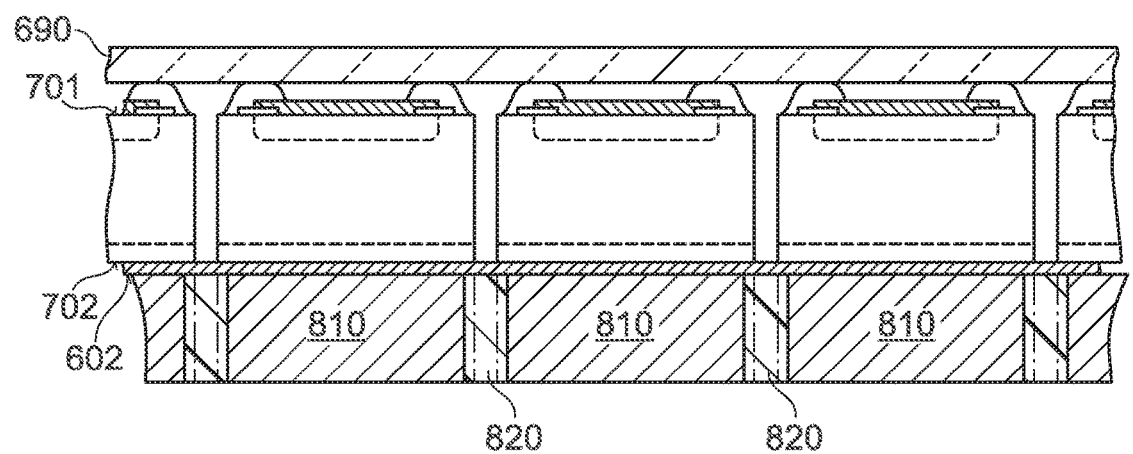

FIG. 6H shows the protection foil 690 at the front side of the workpiece 600. The protection foil 690 may include a layer containing Kapton® and/or Polytetrafluoroethylene (PTFE), by way of example. The sinter process may be completed at a temperature in a range from 200° C. to 270° C., by way of example. After completion of the sintering, the protection foil 690 may be removed.

Figure 6I:
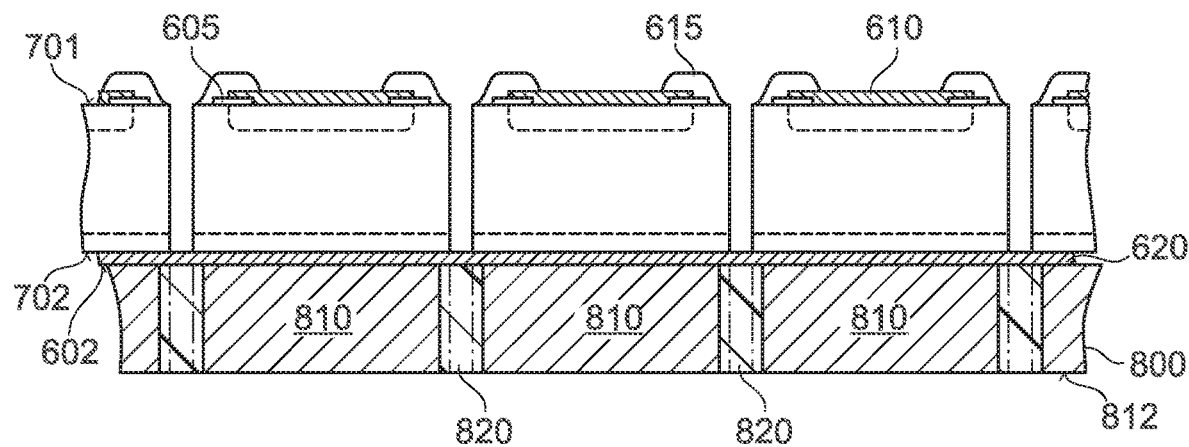

FIG. 6I shows that after removal of the protection foil the wafer assembly is ready for device characterization and dicing. The dicing process may include a sawing process with a sawing blade or laser-assisted cutting through the separation structure 820.

Figure 6J:
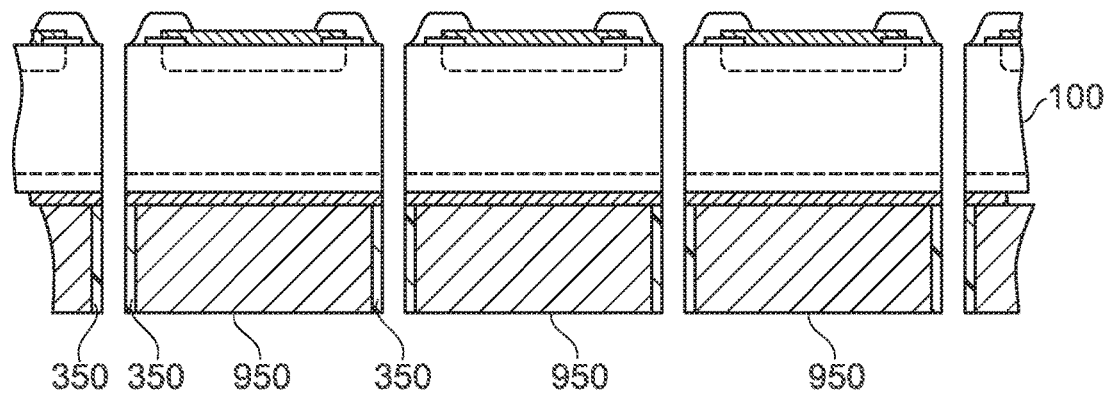

FIG. 6J shows a plurality of semiconductor dies 950 obtained from the wafer assembly of FIG. 6I. Each semiconductor die 950 may include a silicon carbide body 100 formed from a portion of the silicon carbide substrate 700 of FIG. 6A, a metal plate obtained from the metal portions 810 of FIG. 6G, and a frame structure 350 obtained from a remaining portion of the separation structure 820 of FIG. 6G. The frame structure 350 may laterally surround the metal plate 340.

Figure 7:
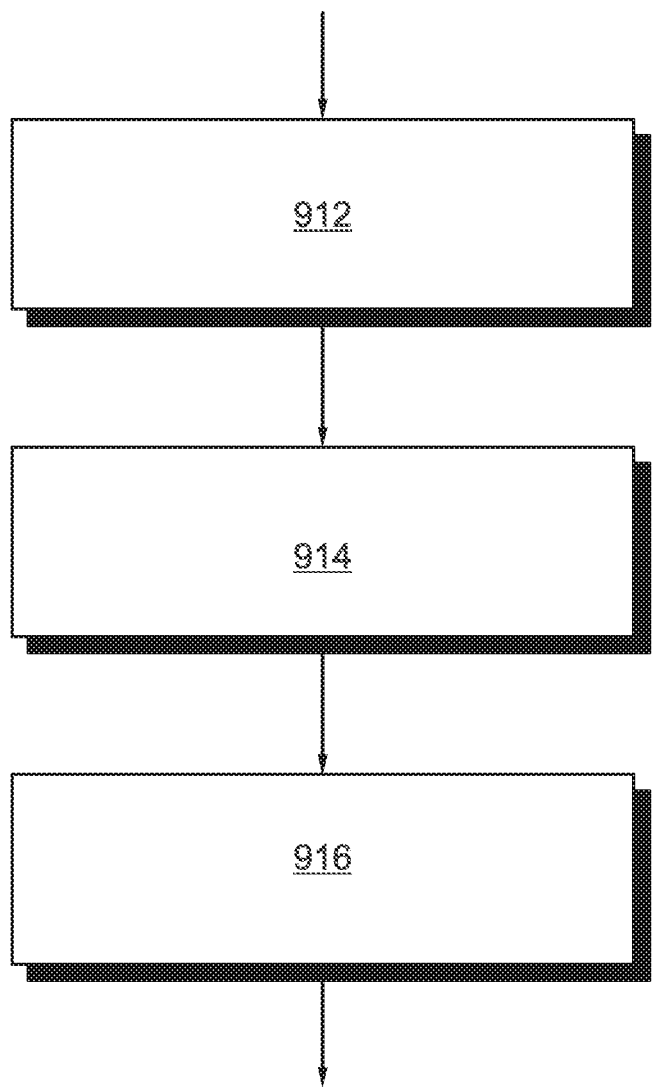
FIG. 7 is a simplified schematic flowchart illustrating a method of manufacturing semiconductor devices according to another embodiment.

FIG. 7 shows a method of manufacturing a semiconductor device. A workpiece is provided (912). The workpiece may include a silicon carbide substrate, a front side metallization at a front side of the silicon carbide substrate and a backside metallization at a backside of the silicon carbide substrate. A metal carrier may be provided (914). The metal carrier and the backside metallization may be connected (916).

Figure 8A:
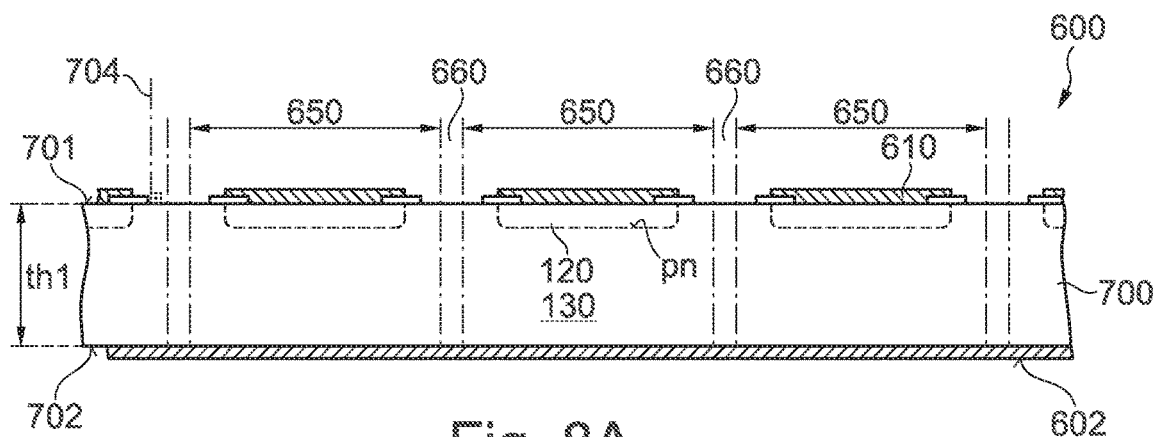
FIGS. 8A-8C show schematic cross-sectional views of a workpiece with a silicon carbide substrate, an auxiliary structure and a wafer assembly according to an embodiment related to an auxiliary structure that includes a flat metal disc.
Figure 8B:
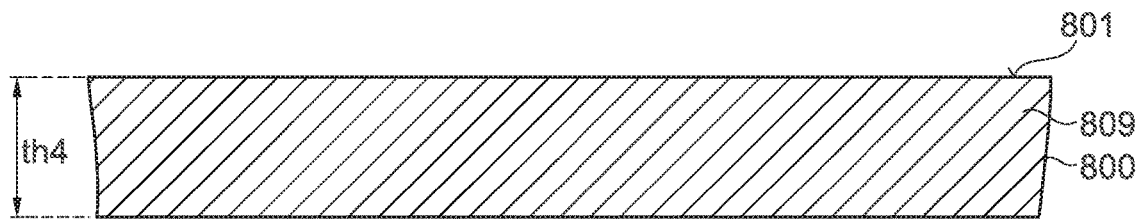
Figure 8C:
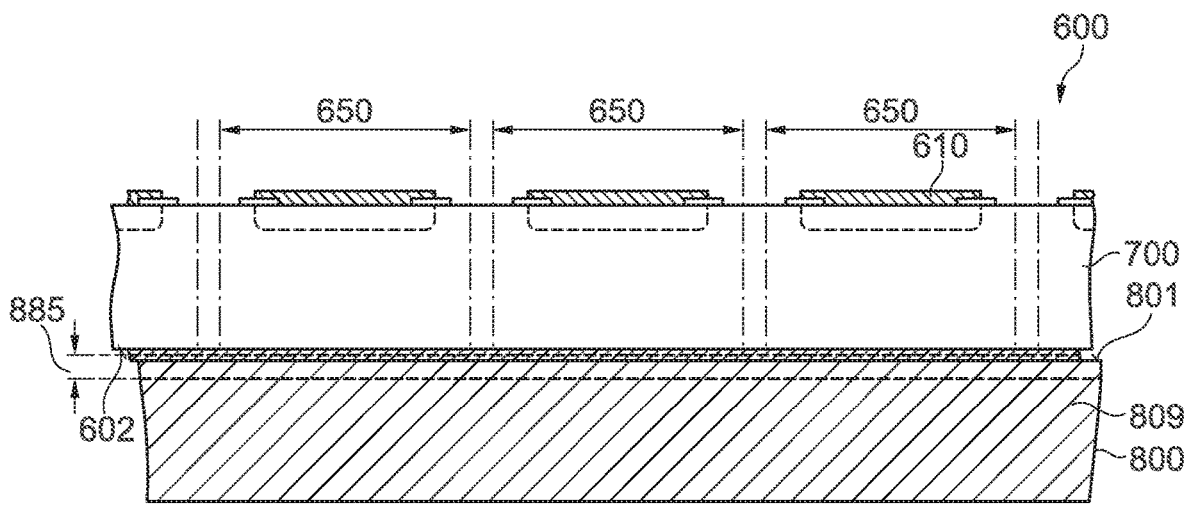

FIGS. 8A-8C illustrate a method of manufacturing semiconductor devices, wherein a metal disc (809) may stabilize a silicon carbide substrate during device characterization and dicing.

FIG. 8A shows a workpiece 600 including a silicon carbide substrate 700, a front side metallization at a front side and a backside metallization 620 at a backside of the silicon carbide substrate. As regards further details, reference is made to the description of the workpiece of FIG. 2A.

FIG. 8B shows an auxiliary structure 800 that includes at least a metal disc 809. A diameter of the metal disc 809 may be approximately the same as a diameter of the workpiece 600. A thickness th4 of the metal disc 809 may be in a range from 30 µm to 300 µm, for example in a range from 80 µm to 120 µm. The metal disc 809 may include copper, silver, tungsten or molybdenum as a main constituent. According to other embodiments the metal disc 809 may include a copper alloy, for example a copper alloy with the main constituents copper and aluminum or with the main constituents copper, aluminum and silicon.

The metal disc 809 of FIG. 8B and the backside metallization 620 of the workpiece 600 of FIG. 8A are mechanically connected by at least one of sintering, diffusion soldering, reaction bonding, or direct bonding.

FIG. 8C shows a wafer assembly including the workpiece 600 of FIG. 8A and the metal disc 809 of FIG. 8B. A Portion of the metal disc 809 directly adjoining the backside metallization 620 and/or a portion of the backside metallization 620 directly adjoining the metal disc 809 may form a transition layer 885. The transition layer 885 may include atoms of a diffusion solder and/or atoms of a sinter paste.

FIGS. 9A-9D illustrate a method of manufacturing semiconductor devices that combines a metal disc 809 with a pre-dicing of semiconductor dies from a backside.

A wafer assembly with the workpiece 600 and an auxiliary carrier 680 bonded on a front side of the workpiece 600 may be provided. For example a wafer assembly may be formed according to a process described with reference to FIGS. 6A-6F, wherein formation of the front side separation trench 705 as illustrated in FIG. 6C may be omitted.

Figure 9A:
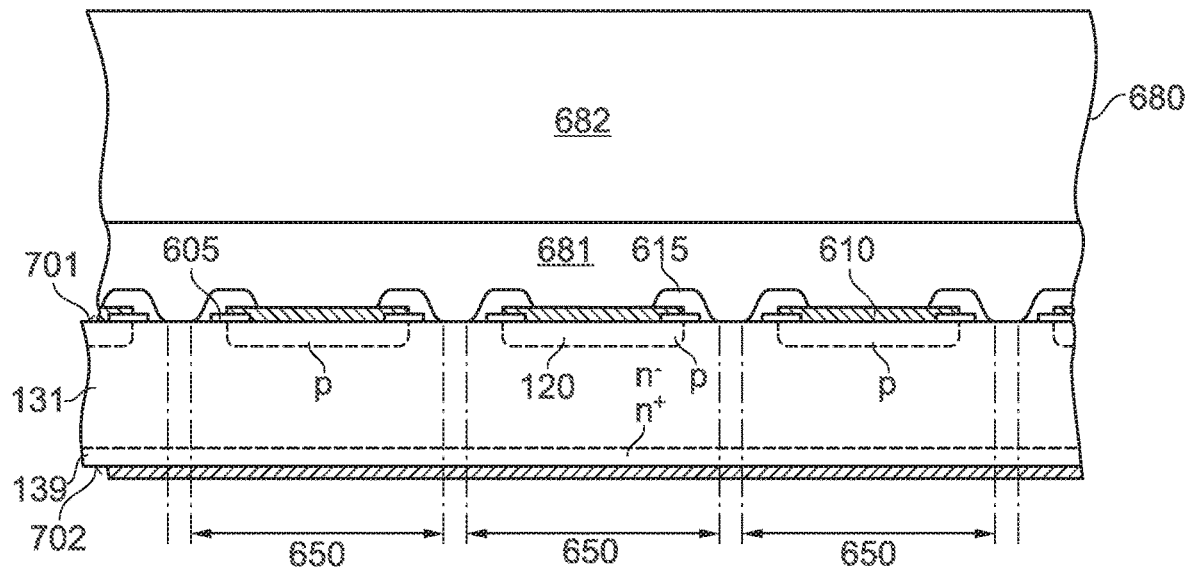
FIGS. 9A-9D illustrate schematic cross-sectional views of a wafer assembly with a silicon carbide substrate according to an embodiment related to a dicing process prior to application of an auxiliary structure.

FIG. 9A shows the auxiliary carrier 680 at a front side of a workpiece 600. The workpiece 600 includes a silicon carbide substrate 700, a front side metallization 610 and a backside metallization 620. For further details, reference is made to the description of FIGS. 6A-6F. A backside separation trench 706 may be formed in the idle region 660 of the workpiece 600, e.g. by sawing.

Figure 9B:
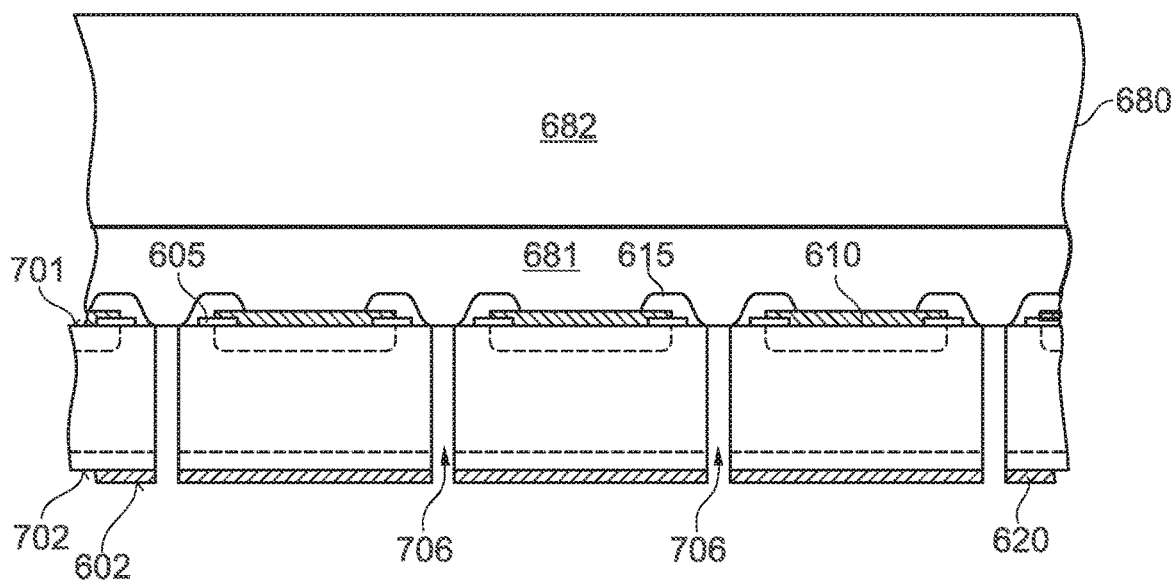

FIG. 9B shows the backside separation trench 706 extending from the backside surface 602 into the workpiece 600. For example, the backside separation trench 706 may extend up to the adhesive layer 681. The backside separation trench 706 may completely separate the device regions 650 from each other.

An auxiliary structure 800 and the workpiece 600 are connected. The auxiliary structure 800 may include a metal disc 809. The metal disc 809 may be connected with the backside metallization 620 through direct bonding, diffusion soldering and/or sintering.

Figure 9C:
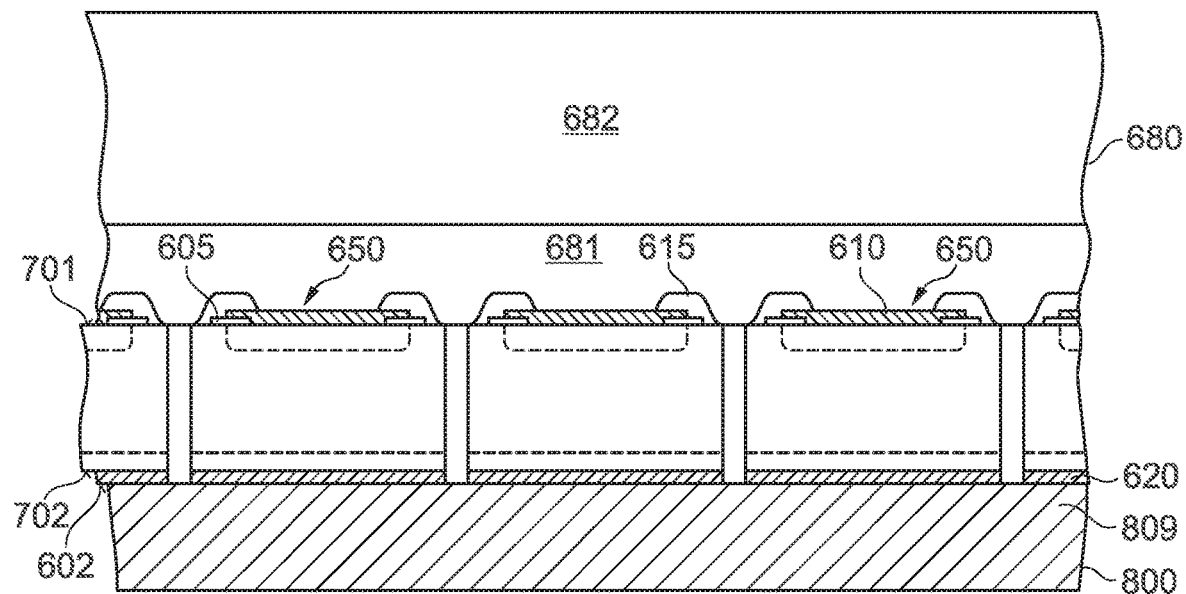

FIG. 9C shows a wafer assembly including the auxiliary carrier 680, laterally separated device regions 650 and the metal disc 809. The auxiliary carrier 680 may be removed.

Figure 9D:
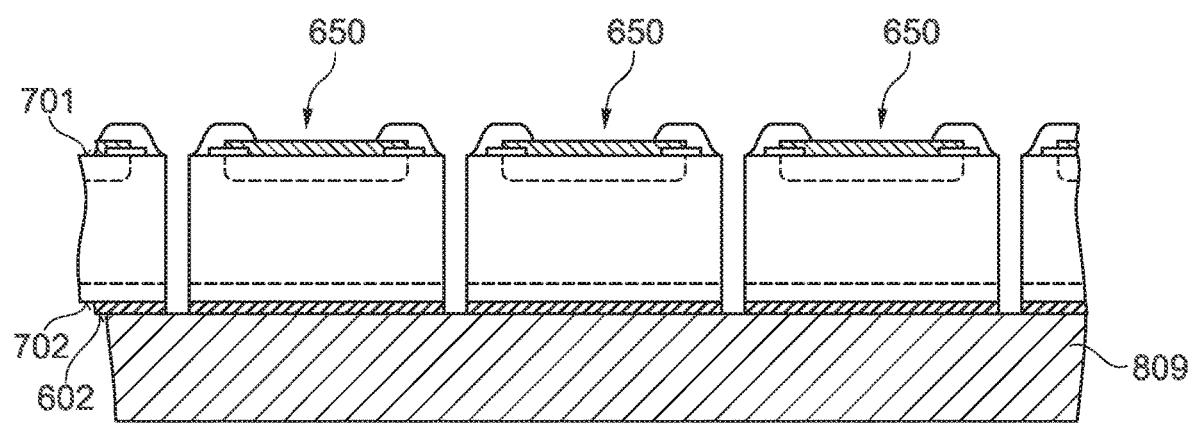

FIG. 9D shows the device regions 650 and the metal disc 809 after removal of the auxiliary carrier 680. The metal disc 809 holds the device regions 650 at the positions the device regions 650 had in the silicon carbide substrate 700 of FIG. 9C. The laterally separated device regions 650 are accessible for electric probing and device characterization.

Semiconductor dies may be cut from the wafer assembly by a process that selectively affects the metal disc 809 such that chipping and the formation of cracks in silicon carbide bodies 100 of the semiconductor dies 950 can be avoided to a high degree.

Figure 10:
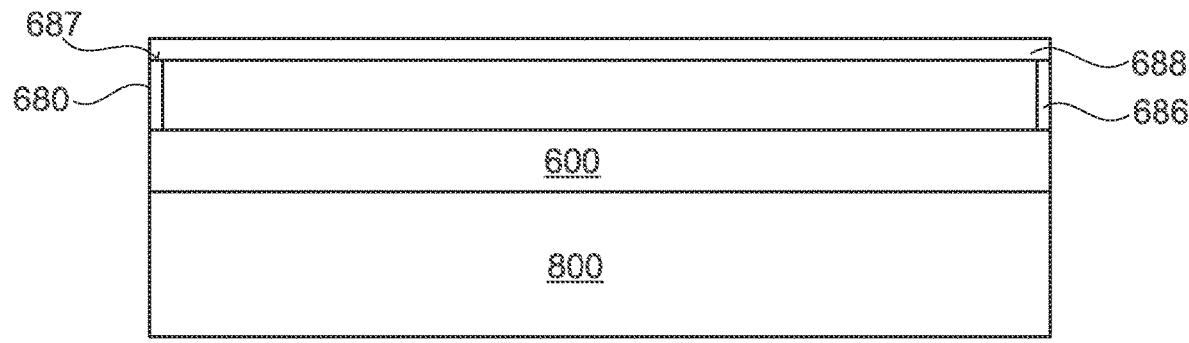
FIG. 10 illustrates a schematic cross-sectional view of a wafer assembly according to an embodiment related to an auxiliary carrier including a ring portion.

In FIG. 10 the auxiliary carrier 680 includes a ring portion 686 from a rigid material that may be thermally bonded along the edge of the workpiece 600. The ring portion 686 may be in contact with the workpiece 600 outside device regions. The auxiliary carrier 680 may include a lid portion 688 fixed on a top surface 687 of the ring portion 686. The ring portion 686 and/or the lid portion 688 may include a glass. A porous material may at least partly fill a space between the lid portion 688 and the workpiece 600. The auxiliary carrier 680 may be used without adhesive layer and may be debonded from the workpiece 600 by, e.g., a local thermal anneal in a simple and conservative manner.

Figure 11:
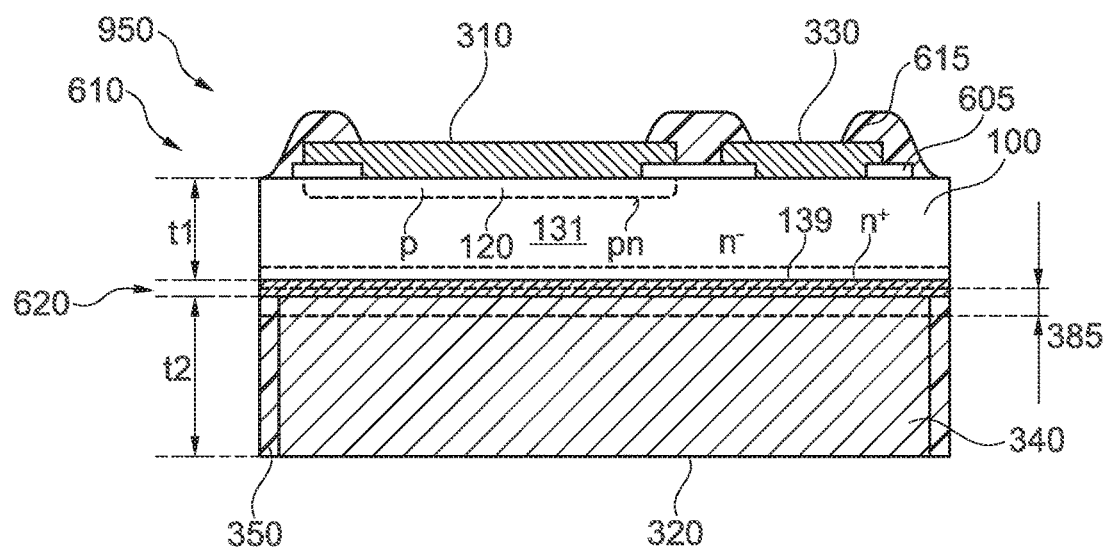
FIG. 11 illustrates a schematic cross-sectional view of a semiconductor die according to another embodiment.
Figure 12:
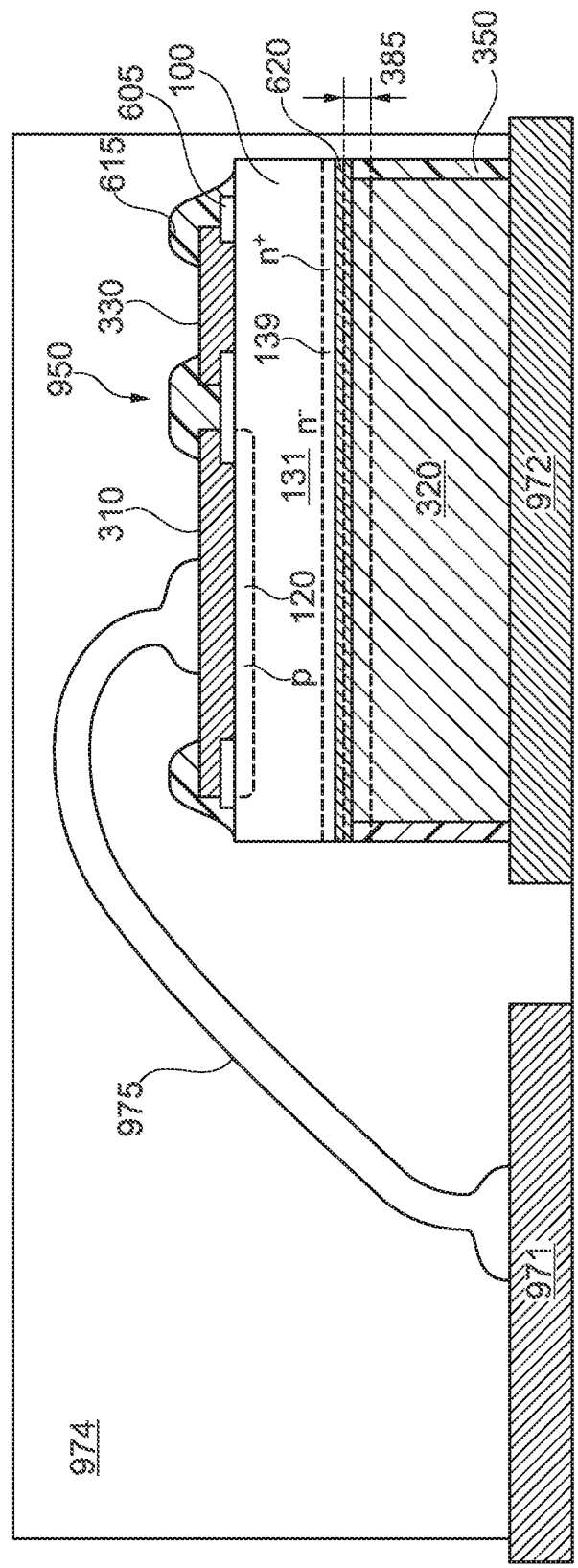
FIG. 12 illustrates a schematic cross-sectional view of a silicon carbide device according to a further embodiment.

FIGS. 11 and 12 show exemplary embodiments of a semiconductor die and a semiconductor device that may be manufactured with a method as described in connection with the embodiments of FIGS. 1, 2A-2C, 3A-3C, 4A-4C, 5A-5C, 6A-6J, 7, 8A-8C, 9A-9D and 10. Vice versa, FIGS. 1, 2A-2C, 3A-3C, 4A-4C, 5A-5C, 6A-6J, 7, 8A-8C, 9A-9D and 10A show exemplary embodiments of a method of manufacturing a semiconductor device, wherein the semiconductor device may be a semiconductor device as described herein, for example, in connection with the embodiments of FIGS. 11 and 12.

The semiconductor die 950 of FIG. 11 may be the semiconductor die of a power semiconductor device that may be used as a switch or rectifier in power electronics. For example, the power semiconductor device may be a semiconductor diode. According to an embodiment the semiconductor die 950 may include a plurality of substantially identical transistor cells electrically arranged in parallel. For example, the semiconductor die may be that of a HEMT (high electron mobility transistor), an IGFET (insulated gate field effect transistor), for example, a MOSFET (metal oxide semiconductor FET), a JFET (junction FET), a merged-pin Schottky diode (MPS diode), an IGBT (insulated gate bipolar transistor), or an MCD (MOS controlled diode) or combinations of them.

The semiconductor die 950 may include a silicon carbide body 100 based on 4H—SiC (silicon carbide of the 4H polytype). A plurality of doped regions may be formed in the silicon carbide body 100. For example, the silicon carbide body 100 may include a first doped region 120 and a second doped region 130. The first doped region 120 may include an emitter region, wherein the emitter region may include the anode region of a power semiconductor diode or may include the body regions of field effect transistor cells. The first doped region 120 and the second doped region 130 may form a pn junction pn. A heavily doped contact portion 139 may be formed along a second surface 102 at a backside of the silicon carbide body 100.

On a first surface 101 at a front side of the silicon carbide body 100 an interlayer dielectric 605 may separate portions of a front side metallization 610 from the silicon carbide body. At least a portion of the front side metallization 610 may be in contact with a first doped region 120, e.g., an emitter region. The front side metallization 610 may include a gate pad 330 and a first load electrode 310 that may include a source pad.

A passivation structure 615 may include a layer that covers vertical edges of the front side metallization 610. The passivation structure 615 may include, for example, glass, polyimide, DLC (diamond-like carbon) and/or silicon nitride. A backside metallization 620 may form part of a second load electrode 320, e.g., a drain electrode. The second load electrode 320 and the contact portion 139 may form an ohmic contact. A thickness t1 of the silicon carbide body 100 may be smaller than 110 µm, for example, at most 90 µm. A metal plate 340 is in contact with the backside metallization 620. A thickness of the metal plate 340 may be in a range from 30 µm to 300 µm, for example from 80 µm to 120 µm.

A portion of the metal plate 340 in direct contact with the backside metallization 620 and/or a portion of the backside metallization 620 in direct contact with the metal plate 340 may form a transition zone 385. The transition zone 385 may include atoms of a diffusion solder and/or atoms of a sinter paste as described above. A non-metal frame structure 350 may laterally surround the metal plate 340 and may be in direct contact with the backside metallization 620. The frame structure 350 may include or consist of crystalline silicon, glass or a resin.

FIG. 12 shows a semiconductor device 500 that may include the semiconductor die 950 as illustrated in FIG. 11. The drain electrode 320 of the semiconductor die 950 may be structurally and electrically connected with a load terminal, e.g., with a drain terminal 972. For example, the drain electrode 320 may be soldered onto the drain terminal 972. A lateral horizontal area of the drain terminal 972 may be significantly greater than a horizontal cross-sectional area of the semiconductor die 950. A thickness of the drain terminal 972 may be in a range from 200 µm to 2000 µm.

The first load electrode 310 may be electrically connected with another load terminal, e.g., a source terminal 971, e.g., through a bond wire 975 or a metal clip. Another bond wire may electrically connect the gate pad 330 with a gate terminal. The drain terminal 972, the source terminal 971 and the gate terminal may be arranged coplanar and may be separated sections of a lead frame. A mold body 974 may encapsulate the bond wire 975, the semiconductor die 950 and parts of the gate terminal, the drain terminal 972 and the source terminal 971.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method of manufacturing a semiconductor device, comprising:
   providing a silicon carbide substrate with a plurality of device regions;
   providing a front side metallization at a front side of the silicon carbide substrate; and
   providing an auxiliary structure at a backside of the silicon carbide substrate, wherein the auxiliary structure comprises a plurality of laterally separated metal portions, and wherein each metal portion is in contact with one device region of the plurality of device regions.

2. The method according to claim 1, wherein the silicon carbide substrate comprises a grid-shaped idle region that laterally separates the plurality of device regions.

3. The method according to claim 1, wherein providing the auxiliary structure comprises:
   structurally connecting a top surface of two or more metal portions of the auxiliary structure with a backside surface of the silicon carbide substrate,
   wherein a separation structure laterally separates a first metal portion of the two or more metal portions from a second metal portion of the two or more metal portions,
   wherein the separation structure comprises at least one of a void, a dielectric auxiliary material, a glass, a resin or a silicon.

4. The method according to claim 3, wherein structurally connecting the top surface of the auxiliary structure with the backside surface of the silicon carbide substrate comprises at least one of:
   sintering, diffusion soldering, or direct bonding.

5. The method according to claim 1, wherein
   the auxiliary structure comprises a metal disc with a grid-shaped trench, and wherein the grid-shaped trench extends from a top surface of the auxiliary structure, at the backside of the silicon carbide substrate, into the metal disc of the auxiliary structure and laterally separates metal portions of the plurality of laterally separated metal portions of the auxiliary structure from each other.

6. The method according to claim 1, wherein providing the auxiliary structure comprises:
   providing an auxiliary base with laterally separated trenches extending from a top surface of the auxiliary structure into the auxiliary base, and forming metal portions of the plurality of laterally separated metal portions in the laterally separated trenches, wherein at least some of the metal portions overlie at least some of the auxiliary base.

7. The method according to claim 1, wherein providing the auxiliary structure at the backside of the silicon carbide substrate comprises:
   forming a separation structure at the backside of the silicon carbide substrate, wherein openings in the separation structure expose the plurality of device regions; and
   forming metal portions of the plurality of laterally separated metal portions in the openings.

8. The method according to claim 1, comprising:
   dividing the silicon carbide substrate and the auxiliary structure into semiconductor dies, wherein each semiconductor die comprises one or more device regions of the plurality of device regions and one or more metal portions of the plurality of laterally separated metal portions.

9. A method of manufacturing a semiconductor device, comprising:
  providing a silicon carbide substrate,
  providing a front side metallization at a front side of the silicon carbide substrate and a backside metallization at a backside of the silicon carbide substrate;
  providing a metal disc, wherein a first thickness of the metal disc is greater than a second thickness of the backside metallization; and
  structurally connecting the metal disc and the backside metallization.

10. The method according to claim 9, comprising:
  forming, prior to structurally connecting the metal disc and the backside metallization, an auxiliary carrier at the front side of the silicon carbide substrate, and
  reducing, after forming the auxiliary carrier and prior to structurally connecting the metal disc and the backside metallization, a thickness of the silicon carbide substrate.

11. The method according to claim 10, wherein
  the auxiliary carrier comprises a ring portion.

12. The method according to claim 10, comprising:
  forming, prior to forming the auxiliary carrier, a front side separation trench extending from the front side into the silicon carbide substrate.

13. The method according to claim 10, wherein reducing the thickness of the silicon carbide substrate comprises:
  splitting off a layer portion of the silicon carbide substrate.

14. The method according to claim 13, wherein splitting off the layer portion comprises:
  implanting ions into the silicon carbide substrate to form a splitting region in the silicon carbide substrate, wherein an absorption coefficient in the splitting region is at least 5 times higher than an absorption coefficient in the silicon carbide substrate outside the splitting region; and
  irradiating the silicon carbide substrate with laser radiation.

15. The method according to claim 10, comprising:
  forming, prior to structurally connecting the metal disc and the backside metallization, a backside separation trench extending from the backside into the silicon carbide substrate.

16. The method according to claim 10, wherein
  the metal disc comprises a grid-shaped trench extending from a top surface of the metal disc into the metal disc, and wherein the top surface is structurally connected with the backside metallization.

17. A semiconductor device, comprising:
  a silicon carbide body;
  a first load electrode at a front side of the silicon carbide body;
  a second load electrode at a backside of the silicon carbide body;
  a metal plate in contact with the second load electrode, wherein a thickness of the metal plate is at least 30 µm and at most 300 µm; and
  a load terminal in contact with the metal plate,
  wherein at least one of:
    the second load electrode comprises at least one of nickel, titanium, or tantalum,
    the metal plate comprises at least one of molybdenum or copper, or
    a non-metal frame structure laterally surrounds the metal plate.

18. The semiconductor device according to claim 17, wherein
  the silicon carbide body comprises a first doped region and a second doped region, the first doped region and the second doped region forming a pn junction,
  the first load electrode is in contact with the first doped region, and
  the second load electrode is in contact with the second doped region.

19. The semiconductor device according to claim 17, wherein
  the thickness of the metal plate is greater than a thickness of the silicon carbide body between the first load electrode and the second load electrode.

20. The semiconductor device according to claim 19, wherein
  the thickness of the silicon carbide body is smaller than 110 µm.

* * * * *